US012696602B2

(12) United States Patent
Huo

(10) Patent No.: US 12,696,602 B2
(45) Date of Patent: Jul. 28, 2026

(54) DISPLAY PANEL AND DISPLAY APPARATUS FOR IMPROVING RESOLUTION

(71) Applicant: Tianma Advanced Display Technology Institute (Xiamen) Co., Ltd., Xiamen (CN)

(72) Inventor: Sitao Huo, Xiamen (CN)

(73) Assignee: Tianma Advanced Display Technology Institute (Xiamen) Co., Ltd., Xiamen (CN)

( * ) Notice: Subject to any disclaimer, the term of this patent is extended or adjusted under 35 U.S.C. 154(b) by 371 days.

(21) Appl. No.: 18/471,013

(22) Filed: Sep. 20, 2023

(65) Prior Publication Data

US 2024/0014366 A1    Jan. 11, 2024

(30) Foreign Application Priority Data

Jun. 30, 2023    (CN) .......................... 202310797389.6

(51) Int. Cl.
| | |
|---|---|
| *H10H 20/857* | (2025.01) |
| *H10H 20/831* | (2025.01) |
| *H10W 90/00* | (2026.01) |

(52) U.S. Cl.
CPC ...... *H10H 20/857* (2025.01); *H10H 20/8312* (2025.01); *H10W 90/00* (2026.01)

(58) Field of Classification Search
CPC ........... H10K 59/8723; H10K 59/8722; H10K 71/00; H10K 50/8426; H10K 50/841; H10K 50/84; H10K 59/871; H01L 23/49582; H01L 23/3107; H01L 23/49548; H01L 23/49575; H01L 24/32; H01L 2224/32245; H01L 23/49541; H01L 23/49503; H01L 25/072; H01L 25/16; H01L 23/49562; H01L 2224/48137; H01L 2224/48247; H01L 2224/48257; H01L 2224/49171; H01L 2224/73265; H01L 2924/181;

(Continued)

(56) References Cited

U.S. PATENT DOCUMENTS

| | | | |
|---|---|---|---|
| 6,518,653 B1 * | 2/2003 | Takagi | .............. H01L 23/49582 257/677 |
| 6,710,430 B2 * | 3/2004 | Minamio | .............. H01L 21/561 257/676 |

(Continued)

*Primary Examiner* — Caleb E Henry
(74) *Attorney, Agent, or Firm* — CHRISTENSEN O'CONNOR JOHNSON KINDNESS PLLC

(57) ABSTRACT

A display panel including a substrate including signal lines, and a light-emitting element group located at a side of the substrate and electrically connected to the signal lines. The light-emitting element group includes light-emitting chips, each including a light-emitting element and a driver circuit that are stacked. The driver circuit is used to drive the light-emitting element to emit light. The light-emitting chips include at least a first light-emitting chip located at the side of the substrate and a second light-emitting chip located at a side of the first light-emitting chip adjacent to the substrate. An orthographic projection area of the second light-emitting chip is smaller than that of the first light-emitting chip in a first direction, and the first direction is perpendicular to a plane of the substrate.

20 Claims, 28 Drawing Sheets

(58) Field of Classification Search
CPC ..... H01L 23/50; H01L 25/18; H01L 25/0753;
H01L 25/167; H01L 25/0756; H10H
20/857; H10H 20/8312; H10H 29/142;
G09F 9/33; H10D 86/441; H10D 86/60;
H10W 90/00
See application file for complete search history.

(56) References Cited

U.S. PATENT DOCUMENTS

| | | | | |
|---|---|---|---|---|
| 7,952,177 | B2 * | 5/2011 | Kawasaki | H01L 23/4334 |
| | | | | 257/692 |
| 8,536,590 | B2 * | 9/2013 | Huang | H01L 25/0753 |
| | | | | 257/98 |
| 9,252,088 | B2 * | 2/2016 | Takada | H01L 23/3142 |
| 9,570,478 | B2 * | 2/2017 | Kim | G02F 1/133345 |
| 9,851,606 | B2 * | 12/2017 | Cha | G02F 1/1339 |
| 9,971,205 | B2 * | 5/2018 | Huang | G02F 1/13394 |
| 10,197,842 | B2 * | 2/2019 | Kobayashi | G02F 1/13439 |
| 11,088,306 | B2 * | 8/2021 | Chen | H10H 20/018 |
| 11,742,464 | B2 * | 8/2023 | Chen | H10H 20/857 |
| | | | | 362/235 |
| 11,881,545 | B2 * | 1/2024 | Chen | H10H 20/81 |
| 12,074,151 | B2 * | 8/2024 | Xu | H01L 24/32 |
| 12,261,255 | B2 * | 3/2025 | Chen | H10F 55/20 |
| 2005/0218489 | A1 * | 10/2005 | Satou | H01L 23/49575 |
| | | | | 257/E23.079 |
| 2006/0163589 | A1 * | 7/2006 | Fan | H10H 29/14 |
| | | | | 257/E25.02 |
| 2010/0259201 | A1 * | 10/2010 | Kawano | H01L 23/49575 |
| | | | | 257/140 |
| 2011/0090445 | A1 * | 4/2011 | Kim | G02F 1/1339 |
| | | | | 349/139 |
| 2011/0291121 | A1 * | 12/2011 | Huang | H01L 25/0753 |
| | | | | 257/E33.075 |
| 2012/0001342 | A1 * | 1/2012 | Sato | H01L 24/49 |
| | | | | 257/773 |
| 2012/0038033 | A1 * | 2/2012 | Oga | H01L 23/49575 |
| | | | | 257/659 |
| 2013/0049137 | A1 * | 2/2013 | Uno | H02M 1/32 |
| | | | | 257/E27.06 |
| 2013/0099261 | A1 * | 4/2013 | Matsumoto | H10H 20/857 |
| | | | | 257/88 |
| 2014/0084436 | A1 * | 3/2014 | Funatsu | H01L 23/49513 |
| | | | | 257/676 |
| 2014/0320789 | A1 * | 10/2014 | Son | G02F 1/133345 |
| | | | | 156/60 |
| 2015/0206830 | A1 * | 7/2015 | Takada | H01L 24/40 |
| | | | | 257/676 |
| 2016/0086875 | A1 * | 3/2016 | Kaneda | H01L 23/49503 |
| | | | | 438/123 |
| 2017/0034916 | A1 * | 2/2017 | Yamagami | H01L 23/49811 |
| 2017/0263594 | A1 * | 9/2017 | Chung | H10H 20/8506 |
| 2018/0182692 | A1 * | 6/2018 | Danno | H01L 23/4952 |
| 2018/0269184 | A1 * | 9/2018 | Liao | H10H 20/857 |
| 2018/0356697 | A1 * | 12/2018 | Ni | H10D 86/60 |
| 2020/0126475 | A1 * | 4/2020 | Ting | G06F 3/0421 |
| 2020/0318815 | A1 * | 10/2020 | Chen | H10H 20/85 |
| 2021/0057607 | A1 * | 2/2021 | Lin | H10H 20/8162 |
| 2021/0202616 | A1 * | 7/2021 | Zhang | H10K 59/131 |
| 2021/0222861 | A1 * | 7/2021 | Hsieh | H10H 20/857 |
| 2021/0336103 | A1 * | 10/2021 | Chen | H10H 20/857 |
| 2021/0359176 | A1 * | 11/2021 | Chen | H10H 20/857 |
| 2021/0384181 | A1 * | 12/2021 | Xu | H01L 24/33 |
| 2022/0045231 | A1 * | 2/2022 | Hsieh | H05B 45/12 |
| 2022/0069047 | A1 * | 3/2022 | Yang | H10K 59/131 |
| 2022/0336721 | A1 * | 10/2022 | Chen | H10H 20/857 |
| 2022/0344313 | A1 * | 10/2022 | Li | H10H 20/8312 |
| 2022/0367432 | A1 * | 11/2022 | Xia | H01L 25/167 |
| 2023/0155062 | A1 * | 5/2023 | Liu | H01L 25/0756 |
| | | | | 257/89 |
| 2023/0253299 | A1 * | 8/2023 | Kuo | H01L 23/3107 |
| | | | | 257/666 |
| 2023/0317697 | A1 * | 10/2023 | Liu | H01L 25/167 |
| 2024/0006568 | A1 * | 1/2024 | Huo | H10H 20/855 |
| 2024/0120451 | A1 * | 4/2024 | Chen | H01L 25/167 |
| 2024/0128305 | A1 * | 4/2024 | Hsu | H10H 20/856 |
| 2024/0322104 | A1 * | 9/2024 | Xu | H10H 20/835 |
| 2025/0192117 | A1 * | 6/2025 | Chen | H10H 20/855 |

* cited by examiner

DISPLAY PANEL AND DISPLAY APPARATUS FOR IMPROVING RESOLUTION

CROSS-REFERENCE TO RELATED APPLICATION

The present application claims priority to Chinese Patent Application No. 202310797389.6, filed on Jun. 30, 2023, the content of which is incorporated herein by reference in its entirety.

TECHNICAL FIELD

The present disclosure relates to the field of display technologies, and in particular, to a display panel and a display apparatus.

BACKGROUND

Light-emitting diode (LED) is a semiconductor element that can convert current into light within a specific wavelength range. The light emission principle is that an energy difference of electrons moving between N-type and P-type semiconductors is released in the form of light. Therefore, LEDs are commonly referred to as cold light sources, which are widely used as light sources due to advantages, including low power consumption, compact size, high brightness, compatibility with integrated circuits, and high reliability. Moreover, with the advancement of LED technologies, the utilization of sub-millimeter LED (Mini LED) displays or Micro LED displays, which directly employ LEDs as self-luminous pixels, has gained popularity. Currently, it is desired to improve the resolution of the Mini LED displays or Micro LED displays.

Therefore, there is a need to develop a display panel and a display apparatus with improved resolution.

SUMMARY

In view of this, the present disclosure provides a display panel and a display apparatus.

According to an aspect, the present disclosure provides a display panel including: a substrate including signal lines and a light-emitting element group located at a side of the substrate and electrically connected to the signal lines.

The light-emitting element group includes light-emitting chips, and each light-emitting chip includes a light-emitting element and a driver circuit that are stacked. The driver circuit is used to drive the light-emitting element to emit light.

The light-emitting chips include at least a first light-emitting chip located at the side of the substrate, and a second light-emitting chip located at a side of the first light-emitting chip adjacent to the substrate. An orthographic projection area of the second light-emitting chip is smaller than an orthographic projection area of the first light-emitting chip in a first direction, and the first direction is perpendicular to a plane of the substrate.

According to another aspect, the present disclosure further provides a display apparatus, including a display panel. The display panel includes a substrate including signal lines and a light-emitting element group located at a side of the substrate and electrically connected to the signal lines.

The light-emitting element group includes light-emitting chips, and each light-emitting chip includes a light-emitting element and a driver circuit that are stacked. The driver circuit is used to drive the light-emitting element to emit light.

The light-emitting chips include at least a first light-emitting chip located at the side of the substrate, and a second light-emitting chip located at a side of the first light-emitting chip adjacent to the substrate. An orthographic projection area of the second light-emitting chip is smaller than an orthographic projection area of the first light-emitting chip in a first direction, and the first direction is perpendicular to a plane of the substrate.

BRIEF DESCRIPTION OF DRAWINGS

The accompanying drawings, which are incorporated in and constitute a part of the specification, illustrate the embodiments of the present disclosure and together with the general description, serve to explain the principles of the present disclosure.

DESCRIPTION OF EMBODIMENTS

Figure 1:
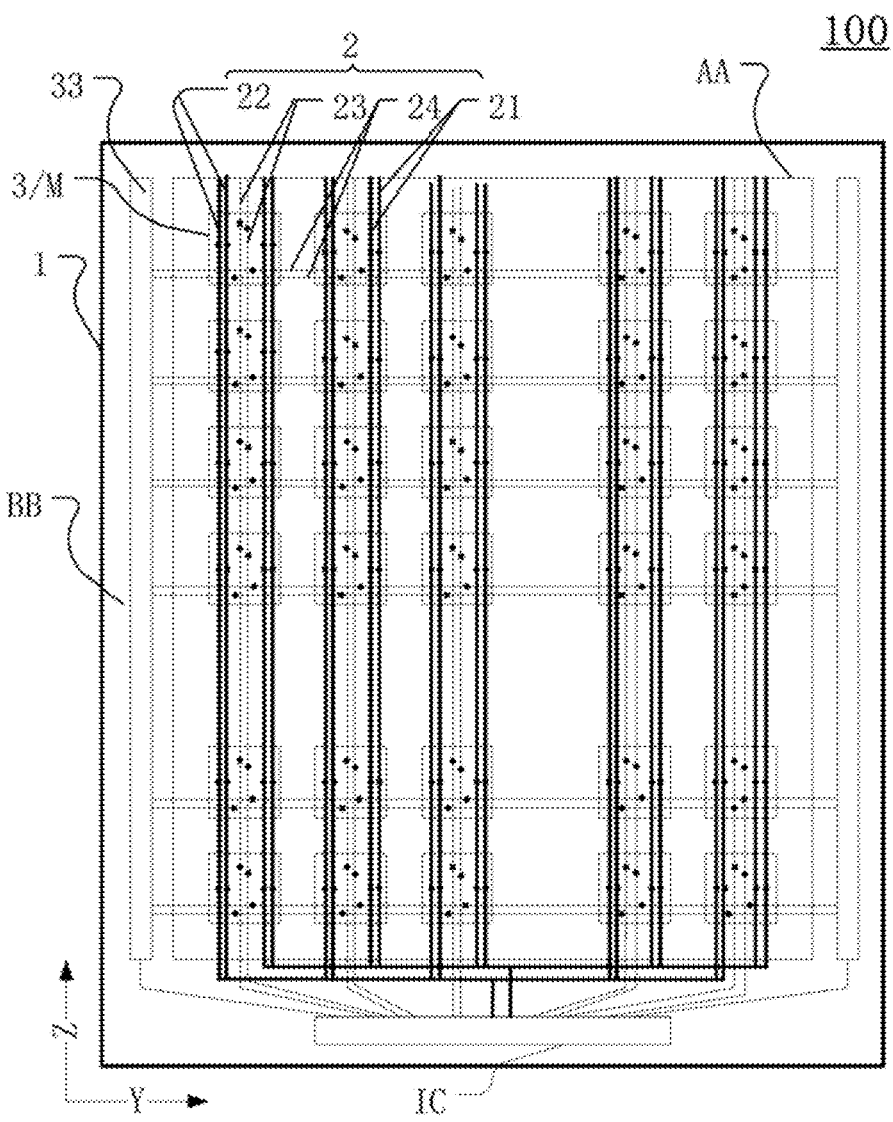
FIG. 1 is a schematic plan view of a display panel according to the present disclosure.

The exemplary embodiments of the present disclosure are described below with reference to the drawings. It should be noted that unless otherwise specified, the relative arrangement, numerical expressions, and numerical values of components and steps set forth in these embodiments do not limit the scope of the present disclosure.

The following description of at least one exemplary example is merely illustrative, and not intended to limit the present disclosure and application or use thereof in any way.

The technologies, methods, and devices known to those of ordinary skill in the art may not be discussed in detail, but where appropriate, the technologies, methods, and devices should be regarded as part of the specification.

In all examples shown and discussed herein, any specific value should be interpreted as merely exemplary, rather than restrictive. Therefore, other examples of exemplary embodiments may have different values.

It should be noted that similar reference numerals and letters represent similar items in the drawings below. Therefore, once an item is defined in one drawing, it does not need to be further discussed in subsequent drawings.

Figure 2:
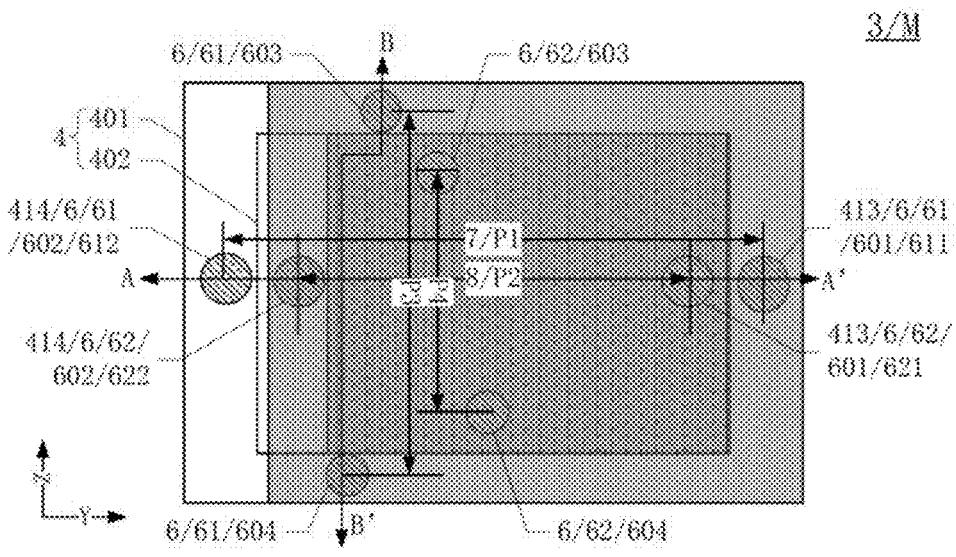
FIG. 2 is a partial enlarged view of a region M in FIG. 1.
Figure 3:
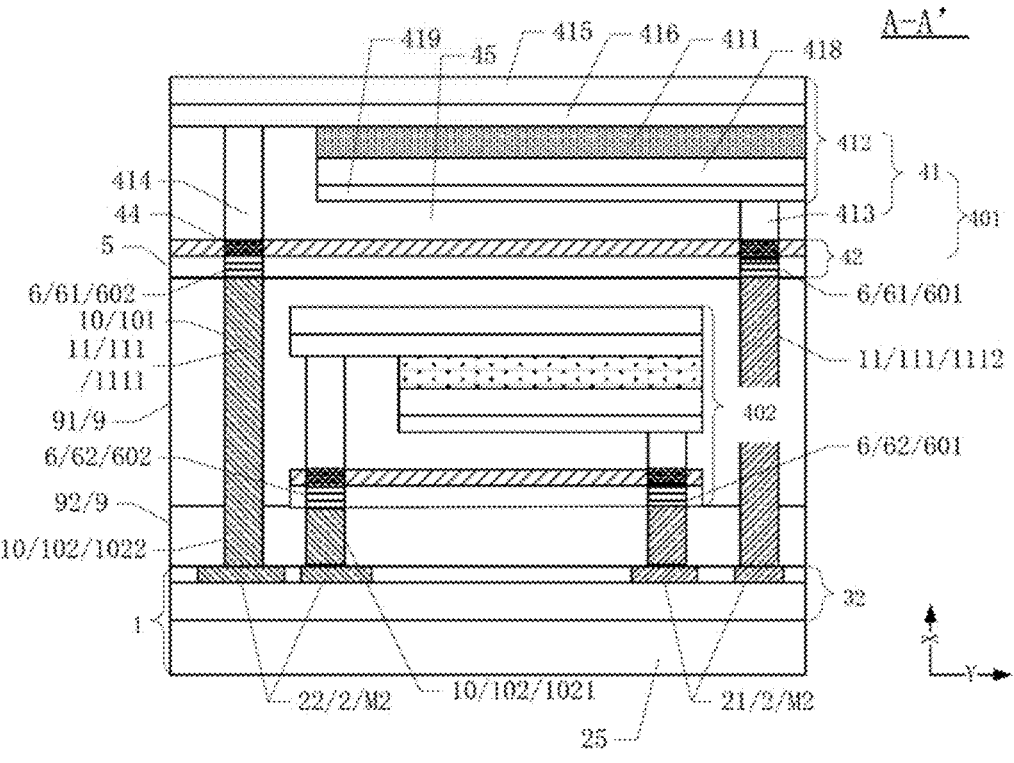
FIG. 3 is a cross-sectional view taken along A-A' in FIG. 2.
Figure 4:
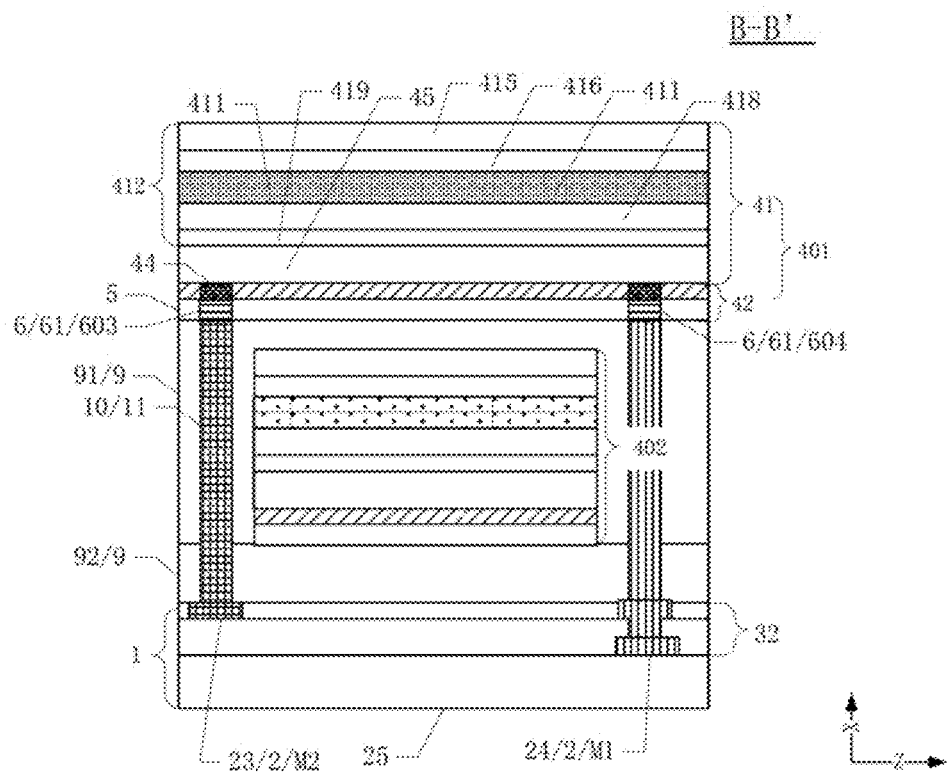
FIG. 4 is a cross-sectional view taken along B-B' in FIG. 2.
Figure 5:
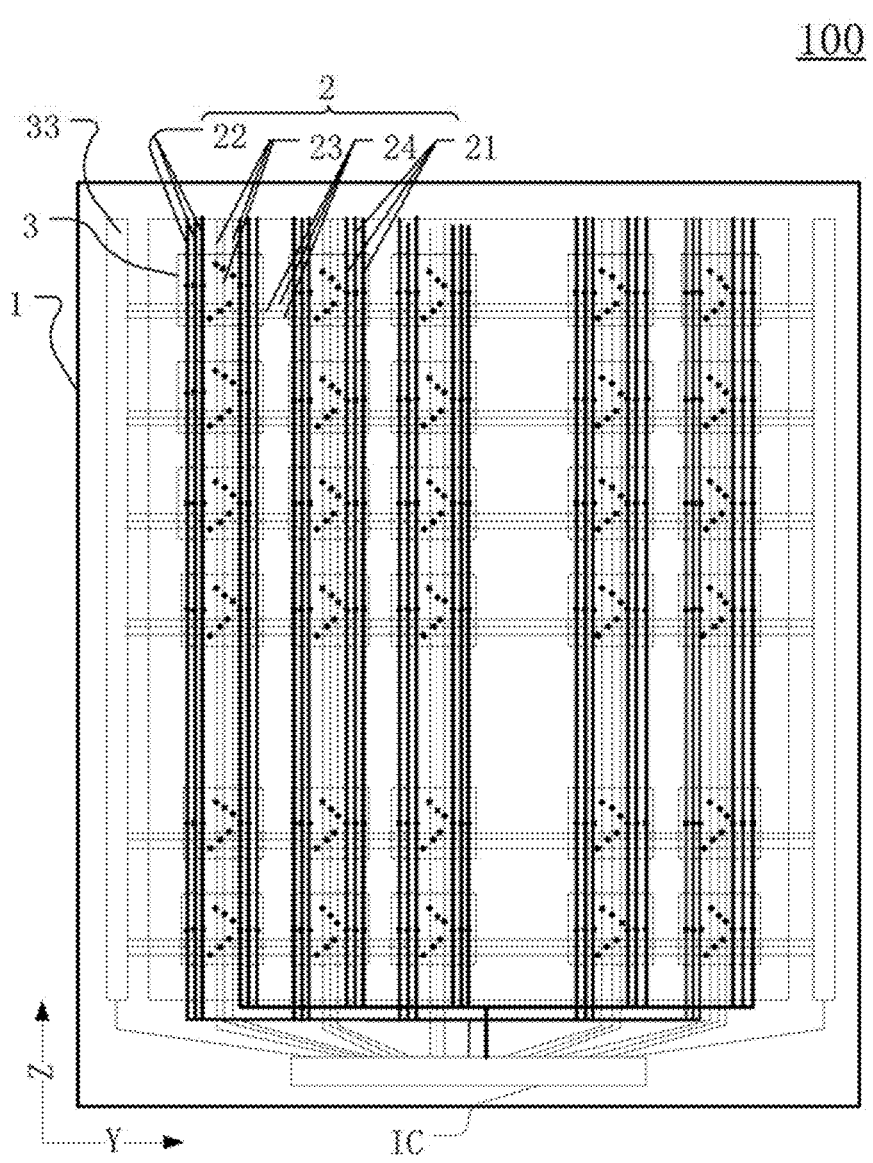
FIG. 5 is a schematic plan view of another display panel according to the present disclosure.

Referring to FIG. 1, FIG. 2, FIG. 3 and FIG. 4, FIG. 1 is a schematic plan view of a display panel according to the present disclosure, FIG. 2 is a partially enlarged view of a region M in FIG. 1, FIG. 3 is a cross-sectional view taken along A-A' in FIG. 2, and FIG. 4 is a cross-sectional view taken along B-B' in FIG. 2. A display panel 100 according to this embodiment includes: a substrate 1 including signal lines 2, and a light-emitting element group 3 located at a side of the substrate 1 and electrically connected to the signal lines 2. The light-emitting element group 3 includes light-emitting chips 4, and each light-emitting chip 4 includes a light-emitting element 41 and a driver circuit 42 that are stacked. The driver circuit 42 is used to drive the light-emitting element 41 to emit light. The light-emitting chips 4 include at least a first light-emitting chip 401 located at a side of the substrate 1 and a second light-emitting chip 402 located at a side of the first light-emitting chip 401 close to the substrate 1. In a first direction X, an orthographic projection area of the second light-emitting chip 402 is smaller than that of the first light-emitting chip 401, and the first direction X is perpendicular to a plane of the substrate 1.

Figure 32:
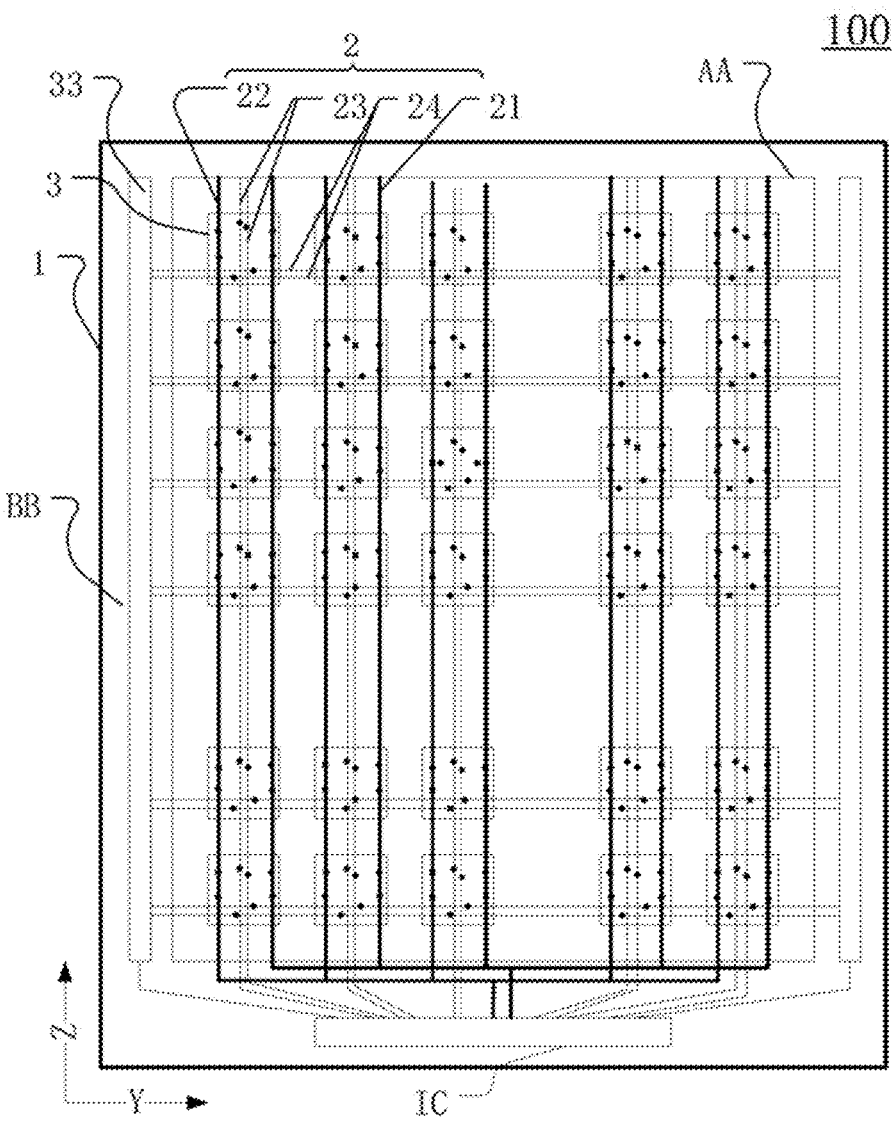
FIG. 32 is a schematic plan view of another display panel according to the present disclosure.

Referring to FIG. 1, the display panel 100 may include a display region AA and a non-display region BB at least partially surrounding the display region AA. The light-emitting element group 3 is located within the display region AA, and the light-emitting element group 3 is not filled with pattern in FIG. 1. As shown in FIG. 3 and FIG. 4, the substrate 1 may include a base substrate 25 and a wiring layer 32 located at a side of the base substrate 25 close to the light-emitting element group 3. In some embodiments, the base substrate 25 may be made of a rigid material or a flexible material. For example, the base substrate 25 is rigid and is made of glass. For another example, the base substrate 25 is flexible and is made of polyimide (P). The material of the base substrate is not limited here. The wring layer 32 includes a plurality of signal lines 2. For example, the signal lines 2 may include a first power signal line 21, a second power signal line 22, a data line 23, and a scanning line 24. The signal lines are not shown in FIG. 2. In some embodiments, the first power signal line 21, the second power signal line 22, and the data line 23 all extend in a third direction Z and are arranged in a second direction Y. The scanning line 24 extends in the second direction Y and is arranged in the third direction Z. The first power signal line 21 is used for transmitting a first power signal and may have a fixed high voltage. The second power signal line 22 is used for transmitting a second power signal and may have a fixed low potential. The data line 23 is used for transmitting a data signal. The first power signal, the second power signal, and the data signal may be provided by a driver integrated chip (IC). A quantity of first power signal lines 21 corresponds to a quantity of light-emitting chips 4, a quantity of second power signal lines 22 corresponds to the quantity of light-emitting chips 4, and a quantity of data lines 23 corresponds to the quantity of light-emitting chips 4. In some embodiments, the light-emitting chips in the light-emitting element group 3 share the first power signal line 21 and the second power signal line 22. For details, refer to FIG. 32. FIG. 32 is a schematic plan view of another display panel according to the present disclosure. The non-display region BB further includes a driver structure 33, and the driver structure 33 provides an enable signal. For example, the driver structure 33 may be a gate driver circuit VSR, and the gate driver circuit VSR provides a strobe signal to the scanning line 24. The driver structure 33 may alternatively be a control chip, which is not limited herein.

In some embodiments, the signal lines 2 may be located in different metal layers. Referring to FIGS. 3 and 4, for example, in the display region, the scanning line 24 is located in a first metal layer M1, and the first power signal line 21 and the second power signal line 22 are located in a second metal layer M2. The second metal layer M2 is located at a side of the first metal layer M1 close to the light-emitting element group. The data line 23 may be located in the second metal layer M2 or a third metal layer (not shown in the figure), and the third metal layer is located at a side of the second metal layer close to the light-emitting element group. The data line 23 located in the second metal layer M2 is shown in FIG. 4 for illustration only. It can be understood that an insulating layer may be provided at a side of the signal line 2 away from the base substrate 25, and bonding pads are formed on the surface of the substrate 1 by forming vias in the insulating layer. The light-emitting element group 3 is attached to the substrate 1 through bonding. The signal lines 2 located on the surface of the substrate are shown in FIG. 3 and FIG. 4 only for illustration, and the actual products are not limited hereto. The signal line 2 in the present disclosure is electrically connected to the light-emitting element group 3, and the electrical signal for driving the light-emitting chip 4 to emit light is transmitted through the signal line 2. Referring to FIG. 3 and FIG. 4, the light-emitting element group 3 may be electrically connected to the signal line 2 in the substrate 1 by vias. The positions of vias are shown in FIG. 1, which is only an example embodiment and is not limited herein. It is understood that usually the width of the first power signal line 21 and the second power signal line 22 are larger. In another embodiment of the present disclosure, the second power signal line 22 is made into a front metal layer, electrical connection is through vias. Certainly, the second power signal line 22 may be arranged in a fourth metal layer located at a side of the first metal layer M1 close to the base 25, which is not shown in the figure.

Referring to FIG. 2 to FIG. 4, the light-emitting element group 3 in the present disclosure includes at least two stacked light-emitting chips 4. The light-emitting chip 4 includes a light-emitting element 41 and a driver circuit 42 stacked with the light-emitting element 41, and the light-emitting element 41 emits light under the drive of the driver circuit 42. In some embodiments, the driver circuit 42 includes, for example, a 1T1C driver circuit, a 7T1C driver circuit, or an 8T1C driver circuit. T refers to the transistor, and C refers to the storage capacitor. The electronic components included in the driver circuit are not limited herein, as long as the driver circuit can supply the drive current to the light-emitting element 41. In some embodiments, the driver circuit 42 may further include a digital circuit, which is not limited herein. In some embodiments, the light-emitting element 41 is a Mini LED or a Micro LED. In some embodiments, there may be a planarization structure 45 between the light-emitting element 41 and the driver circuit 42. In some other embodiments, there is no planarization structure 45.

It should be noted that the driver circuit 42 in the present disclosure may be transparent or semi-transparent. Even if the driver circuit 42 is a semi-transparent structure, only the positions at which electronic components of the driver circuit 42 are disposed are not transparent, but the gaps between the electronic components are transparent, thereby reducing light blocking to the light-emitting chip.

The light-emitting element 41 located at the side of the driver circuit 42 away from the substrate 1 is shown in FIGS. 3 and 4 for illustration only. Certainly, the light-emitting element 41 may be located at a side of the driver circuit 42 close to the substrate 1, which is not shown in the figures.

In some embodiments, the first light-emitting chip 401 and the second light-emitting chip 402 have rectangular or circular orthographic projections on the plane of the substrate 1. When the first light-emitting chip 401 and the second light-emitting chip 402 have circular orthographic projections on the plane of the substrate 1, the diameter of the first light-emitting chip 401 is greater than that of the second light-emitting chip 402. When the first light-emitting chip 401 and the second light-emitting chip 402 have rectangular orthographic projections on the plane of the substrate, a length of the first light-emitting chip 401 in the second direction Y is greater than that of the second light-emitting chip 402, and the length of the first light-emitting chip 401 in the third direction Z is greater than that of the second light-emitting chip 402.

Conventionally, the light-emitting elements are arranged flat on the substrate. Although the size of the Mini LEDs or Micro LEDs is small, the Mini LEDs or Micro LEDs require some space for parallel arrangement, and the resolution of the display panel cannot be further improved. On the other hand, it is necessary to dispose driver circuits on the substrate to provide the drive current for the Mini LEDs or Micro LEDs, and the driver circuits are in one-to-one correspondence with the Mini LEDs or Micro LEDs. The driver circuits also occupy larger space on the substrate. Even if the distance between the Mini LEDs or Micro LEDs is reduced, the driver circuits cannot be compressed, and the resolution of the display panel cannot be further improved.

The light-emitting element group 3 of the present disclosure includes at least two stacked light-emitting chips 4, and the at least two light-emitting chips 4 include at least a first light-emitting chip 401 located at a side of the substrate 1, and a second light-emitting chip 402 located at a side of the first light-emitting chip 401 close to the substrate 1. Compared to the conventional art in which the light-emitting chips 4 are arranged in parallel on the substrate 1, at least two light-emitting chips 4 in the light-emitting element group 3 are stacked in the first direction X in the present disclosure, thereby improving the resolution.

On the other hand, because the light-emitting chip 4 includes a light-emitting element 41 and a driver circuit 42 that are stacked, the light-emitting chip 4 has both light-emitting and driving functions, such that there is no need to provide the driver circuit in the substrate 1 to drive the light-emitting element 41 to emit light. The driver circuit 42 of the light-emitting chip 4 can drive the light-emitting element 41 to emit light, and only the signal lines 2 are provided on the substrate 1. This can improve the space utilization rate of the substrate 1 and further improve the resolution of the display panel.

According to the present disclosure, in the first direction X, the orthographic projection area of the second light-emitting chip 402 is smaller than that of the first light-emitting chip 401, and the first direction X is perpendicular to the plane of the substrate 1. Because the first light-emitting chip 401 farther from the substrate 1 has a larger area, it facilitates stacking. When the first light-emitting chip 401 and the second light-emitting chip 402 are connected to the substrate 1, wires can be reduce, so as to reduce wiring space and further improve the resolution.

Figure 6:
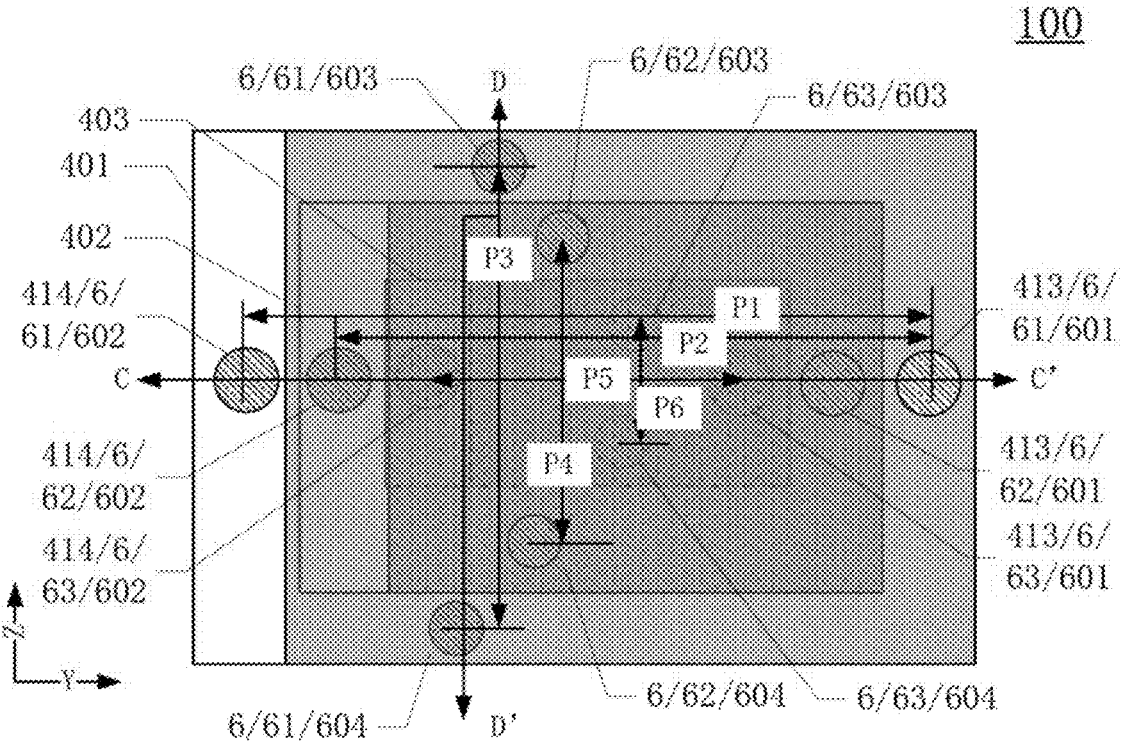
FIG. 6 is a schematic plan view of another display panel according to the present disclosure.
Figure 7:
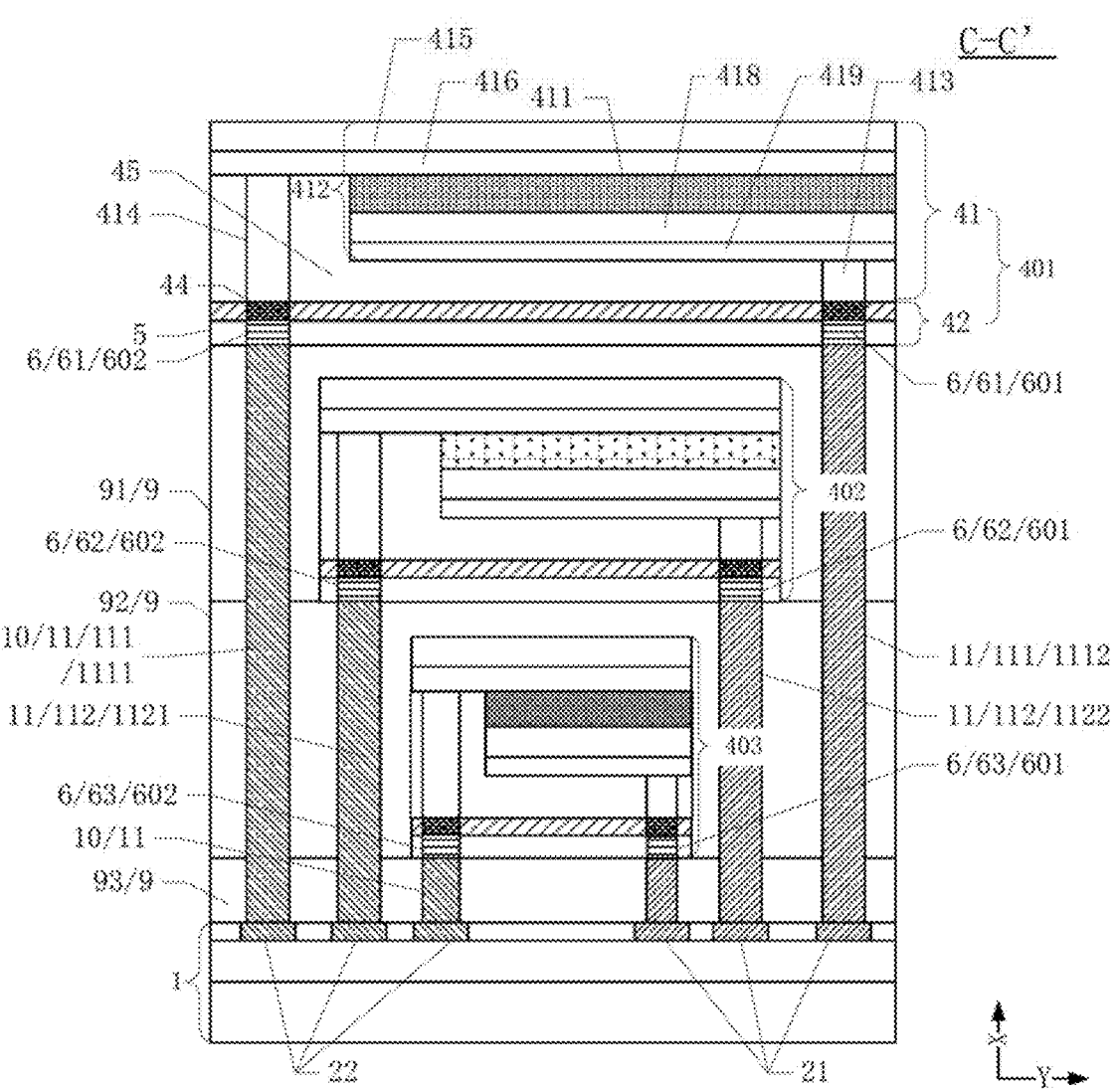
FIG. 7 is a cross-sectional view taken along C-C' in FIG. 6.
Figure 8:
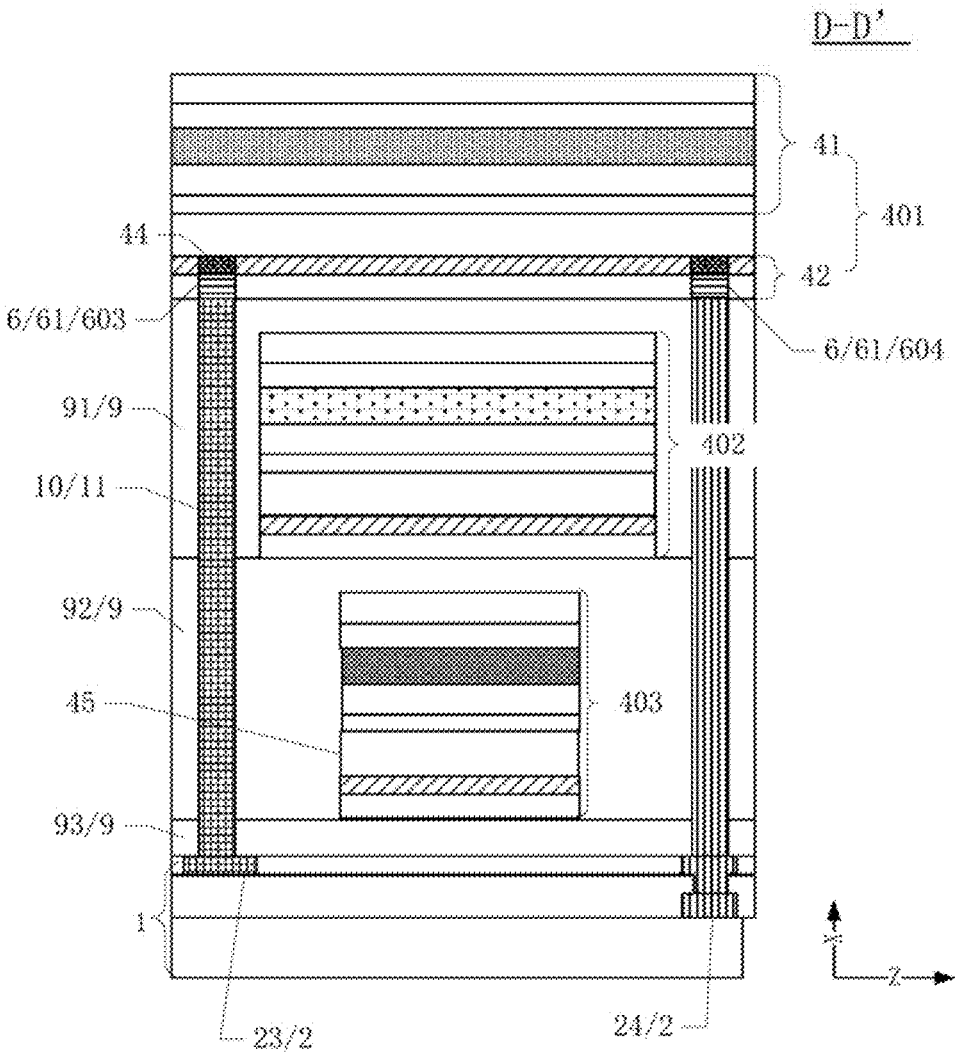
FIG. 8 is a cross-sectional view taken along D-D' in FIG. 6.
Figure 18:
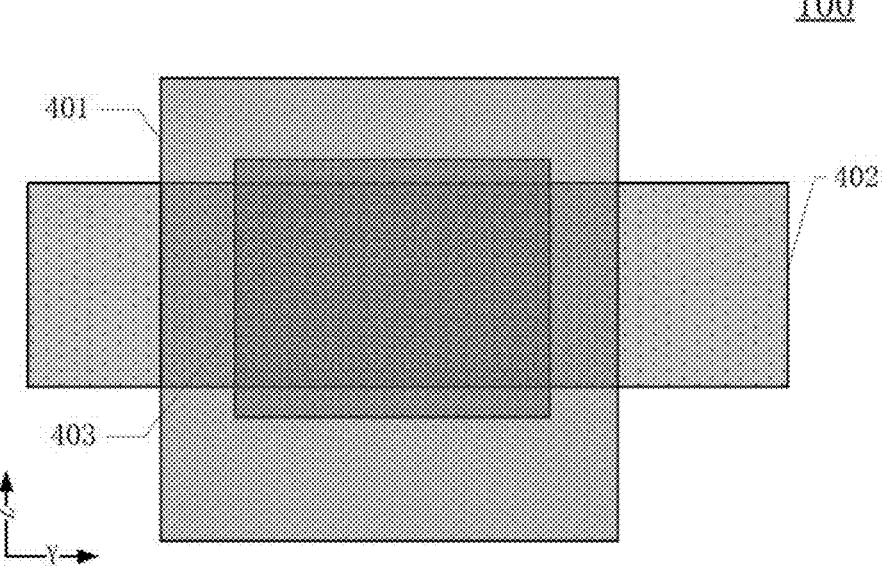
FIG. 18 is a schematic plan view of another display panel according to the present disclosure.

In some embodiments, referring to FIG. 5, FIG. 6, FIG. 7 and FIG. 8, FIG. 5 is a schematic plan view showing a structure of another display panel according to the present disclosure, FIG. 6 is a schematic plan view showing a structure of another display panel according to the present disclosure, FIG. 7 is a cross-sectional view taken along C-C' in FIG. 6, and FIG. 8 is a cross-sectional view taken along D-D' in FIG. 6. Also referring to FIG. 18, FIG. 18 is a schematic plan view showing a structure of another display panel according to the present disclosure. FIG. 18 schematically shows a positional relationship between a first light-emitting chip 401, a second light-emitting chip 402, and a third light-emitting chip 403, but does not show specific structures of the first light-emitting chip 401, the second light-emitting chip 402, and the third light-emitting chip 403. The display panel according to this embodiment further includes the third light-emitting chip 403 located at a side of the second light-emitting chip 402 close to a substrate 1. In a direction perpendicular to a plane of the substrate 1, an orthographic projection area of the third light-emitting chip 403 is smaller than that of the second light-emitting chip 402.

In this embodiment, the light-emitting element group 3 according to the present disclosure includes three stacked light-emitting chips 4, and the first light-emitting chip 401, the second light-emitting chip 402, and the third light-emitting chip 403 are different in emission color. The light-emitting chips 4 of three emission colors are stacked to realize colorful light.

In this embodiment, the third light-emitting chip 403 is located at a side of the substrate 1 close to the light exit surface, the second light-emitting chip 402 is located at a side of the third light-emitting chip 403 close to the light exit surface, and the first light-emitting chip 401 is located at a side of the second light-emitting chip 402 close to the light exit surface. Compared to the conventional art in which the light-emitting chips 4 are arranged in parallel on the substrate 1, the three light-emitting chips 4 in the light-emitting element group 3 are stacked in the first direction X in the present disclosure, thereby improving the resolution.

According to the present disclosure, in the first direction X, the orthographic projection area of the third light-emitting chip 403 is smaller than that of the second light-emitting chip 402, and the orthographic projection area of the second light-emitting chip 402 is smaller than that of the first light-emitting chip 401. Because the areas of the first light-emitting chip 401, the second light-emitting chip 402, and the third light-emitting chip 403 at the side of the substrate 1 gradually decrease, it facilitates stacking. When the first light-emitting chip 401, the second light-emitting chip 402, and the third light-emitting chip 403 are connected to the substrate 1, wires can be reduce, so as to reduce the wiring space and further improve the resolution.

In some embodiments, still referring to FIG. 5 to FIG. 8, the first light-emitting chip 401 is a blue light-emitting chip, the second light-emitting chip 402 is one of a red light-emitting chip and a green light-emitting chip, and the third light-emitting chip 403 is the other of the red light-emitting chip and the green light-emitting chip.

In an embodiment of the present disclosure, the first light-emitting chip 401 is a blue light-emitting chip, the second light-emitting chip 402 is a red light-emitting chip, and the third light-emitting chip 403 is a green light-emitting chip. In another embodiment of the present disclosure, the first light-emitting chip 401 is a blue light-emitting chip, the second light-emitting chip 402 is a green light-emitting chip, and the third light-emitting chip 403 is a red light-emitting chip. The three colors of light emitted by the red light-emitting chip, the green light-emitting chip, and the blue light-emitting chip are mixed to realize color display. In FIG. 6, FIG. 7, and FIG. 8, light-emitting material layers 411 are filled with different patterns to indicate different colors of the light emitted by the light-emitting chips.

Generally, it is understood that among red light, the bule light, and the green light, red light has the lowest energy, blue light has the highest energy, and energy of green light is less than that of blue light and greater than the of the red light. If the blue light-emitting chip is located close to the substrate 1, the blue light is incident on the red light-emitting chip or the green light-emitting chip. The high-energy blue light causes re-excitation of the red light-emitting material in the red light-emitting chip and the green light-emitting material in the green light-emitting chip, resulting in a color cast.

In this embodiment, the blue light-emitting chip with the highest energy is located away from the substrate 1, that is, the first light-emitting chip 401 is the blue light-emitting chip. This arrangement helps prevent the re-excitation of the red light-emitting chip and the green light-emitting chip. Certainly, the energy of the red light and the green light is low, and they do not cause re-excitation of other light-emitting materials. Only one of the second light-emitting chip 402 and the third light-emitting chip 403 needs to be the red light-emitting chip or the green light-emitting chip.

In some embodiments, still referring to FIG. 3, FIG. 4, FIG. 7, and FIG. 8, the light-emitting element 41 includes a light-emitting material layer 411. The light-emitting material layer 411 of the first light-emitting chip 401 has a luminous efficacy lower than a luminous efficacy of the light-emitting material layer 411 of the second light-emitting chip 402.

The luminous efficacy is a parameter of the light-emitting chip. The luminous efficacy refers to the ratio of luminous flux to power and is measured as the ratio of the luminous flux (measured in lumens) generated by an electric light source by consuming electrical power of 1 watts. The electric light source converts electrical power into light. The luminous efficacy reflects the total effect of energy excitation, energy transfer, recombination luminescence, and non-radiative recombination in the luminous body, and is influenced by the composition of the luminous body, the type and concentration of the luminescence center, the coactivator, control of harmful impurities, the integrity of the luminescent crystal, and even the specific manufacturing process. Under the same power, smaller luminous efficacy of the light-emitting material layer indicates a lower luminous flux.

A light-emitting chip 4 with lower luminous efficacy is used as the first light-emitting chip 401. Viewed in the first direction X, the area of the light-emitting material layer 411 of the first light-emitting chip 401 is larger than that of the light-emitting material layer 411 of the second light-emitting chip 402. Therefore, the light-emitting area of the first light-emitting chip 401 is larger than that of the second light-emitting chip 402, and the luminous efficacy of the light-emitting material layer 411 of the first light-emitting chip 401 is less than that of the light-emitting material layer 411 of the second light-emitting chip 402. This ensures that the exit light amount of the first light-emitting chip 401 is close to that of the second light-emitting chip 402, and avoids color cast caused by the difference in luminous efficacy.

According to the present disclosure, the light-emitting chip 4 with lower luminous efficacy has a larger light-emitting material layer 411, which can also balance the power consumption. Conventionally, because the light-emitting material layers 411 of the light-emitting chips 4 have the same area, larger current is required to drive the light-emitting chip 4 with lower efficacy in order to balance the luminance of the light-emitting chip 4 with lower efficacy and the luminance of the light-emitting chip 4 with higher efficacy. As a result, the light-emitting chip 4 with lower efficacy has higher power consumption. In order to reduce the impact of power consumption, the light-emitting material layer 411 of the light-emitting chip 4 with lower efficacy in the present disclosure has a larger area, such that it is not necessary to increase the drive current of the first light-emitting chip 401, and thus the overall power consumption can be reduced.

In some embodiments, the luminous efficacy of the light-emitting material layers 411 of the first light-emitting chip 401, the second light-emitting chip 402, and the third light-emitting chip 403 successively increases, and the areas in the first direction X of the first light-emitting chip 401, the second light-emitting chip 402, and the third light-emitting chip 403 successively decrease. In this way, the exit light amounts of the first light-emitting chip 401, the second light-emitting chip 402, and the third light-emitting chip 403 are close to each other, which can prevent different luminous efficacy of the light-emitting material layers 411 of the first light-emitting chip 401, the second light-emitting chip 402, and the third light-emitting chip 403 from causing color cast when the colors are mixed, and also reduce the power consumption.

In some embodiments, still referring to FIG. 3, FIG. 4. FIG. 7, and FIG. 8, the first light-emitting chip 401 is a red light-emitting chip, and the second light-emitting chip 402 is a green light-emitting chip or a blue light-emitting chip.

Conventionally, the light-emitting material layer of the red light-emitting chip adopts a quaternary material aluminum gallium indium phosphide (AlInGaP), which has the lowest luminous efficacy. In the present disclosure, the red light-emitting chip is disposed farthest from the substrate 1. The light-emitting material of the green light-emitting chip usually adopts the binary material gallium nitride (GaN), the light-emitting material layer of the blue light-emitting chip usually adopts a ternary material indium gallium nitride (InGaN), and the luminous efficacy of the binary material GaN and the ternary material InGaN are close to each other. Therefore, the second light-emitting chip 402 may be either the green light-emitting chip or the blue light-emitting chip. In some embodiments, the first light-emitting chip 401 is a red light-emitting chip, the second light-emitting chip 402 is a blue light-emitting chip, and the third light-emitting chip 403 is a green light-emitting chip. In some embodiments, the first light-emitting chip 401 is a red light-emitting chip, the second light-emitting chip 402 is a green light-emitting chip, and the third light-emitting chip 403 is a blue light-emitting chip.

The red light-emitting chip with lower luminous efficacy is used as the first light-emitting chip 401. In the first direction X, the area of the light-emitting material layer 411 of the red light-emitting chip is larger than that of the light-emitting material layer 411 of the blue or green light-emitting chip, such that the light-emitting area of the red light-emitting chip is larger than that of the blue or green light-emitting chip. The luminous efficacy of the light-emitting material layer 411 of the red light-emitting chip is less than that of the light-emitting material layer 411 of the blue or green light-emitting chip. This ensures that the exit light amounts of the red light-emitting chip, the blue light-emitting chip, and the green light-emitting chip are close to each other, avoids color cast caused by the difference in luminous efficacy, and reduces power consumption.

Figure 9:
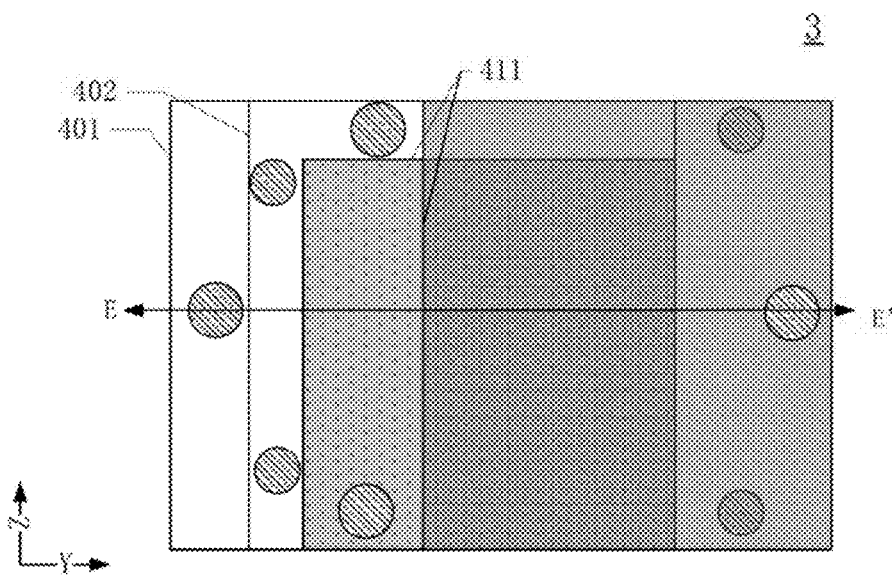
FIG. 9 is a schematic plan view of another display panel according to the present disclosure.
Figure 10:
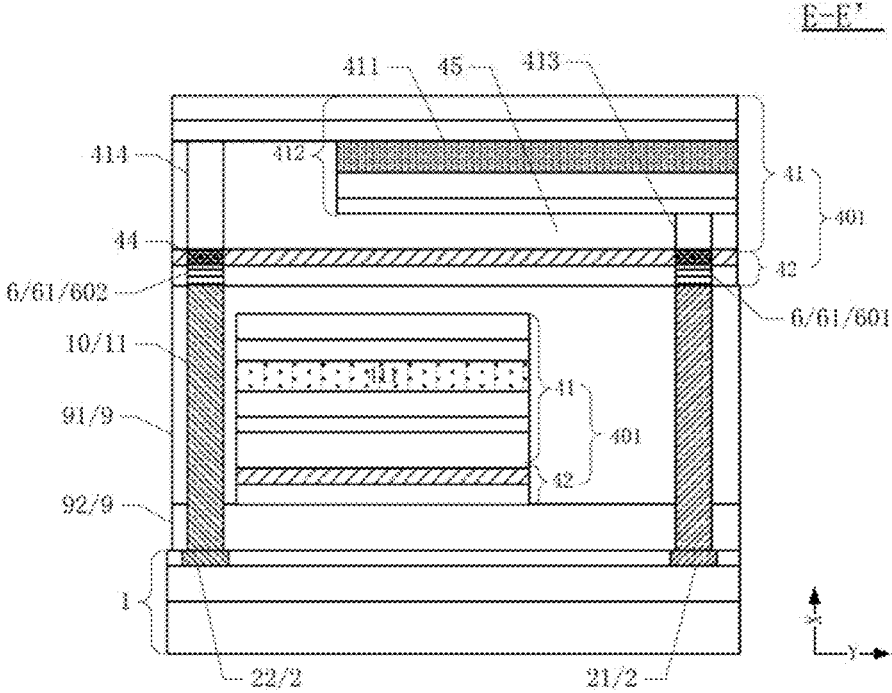
FIG. 10 is a cross-sectional view taken along E-E' in FIG. 9.

In some embodiments, still referring to FIG. 9 and FIG. 10, FIG. 9 is a schematic plan view showing a structure of another display panel according to the present disclosure, and FIG. 10 is a cross-sectional view taken along E-E' in FIG. 9. The light-emitting element 41 in this embodiment includes a light-emitting material layer 411. Orthographic projections of the light-emitting material layer 411 of the first light-emitting chip 401 and the light-emitting material layer 411 of the second light-emitting chip 402 on the substrate 1 are at least partially non-overlapping.

It is understood that electrons and holes are injected into the light-emitting material layer 411, and the electrons and holes undergo radiative combination within the light-emitting material layer 411, generating light having a corresponding wavelength and realizing the conversion of electrical energy into light energy.

The orthographic projections of the light-emitting material layer 411 of the first light-emitting chip 401 and the light-emitting material layer 411 of the second light-emitting chip 402 on the substrate 1 are at least partially non-overlapping, such that at least part of the exit light from the second light-emitting chip 402 does not pass through the light-emitting material layer 411 of the first light-emitting chip 401. This can reduce the influence of the light-emitting material layer 411 of the first light-emitting chip 401 on the exit light from the second light-emitting chip 402, and light mixing effect is improved.

On the other hand, when the second light-emitting chip 402 is a blue light-emitting chip, the blue light emitted by the blue light-emitting chip has high energy, and the red light-emitting material and the green light-emitting material may be excited by the blue light. The orthographic projections of the light-emitting material layer 411 of the first light-emitting chip 401 and the light-emitting material layer 411 of the second light-emitting chip 402 on the substrate 1 are at least partially non-overlapping, which can reduce the excitation of the light-emitting material in the first light-emitting chip 401 caused by the blue light-emitting chip.

Figure 11:
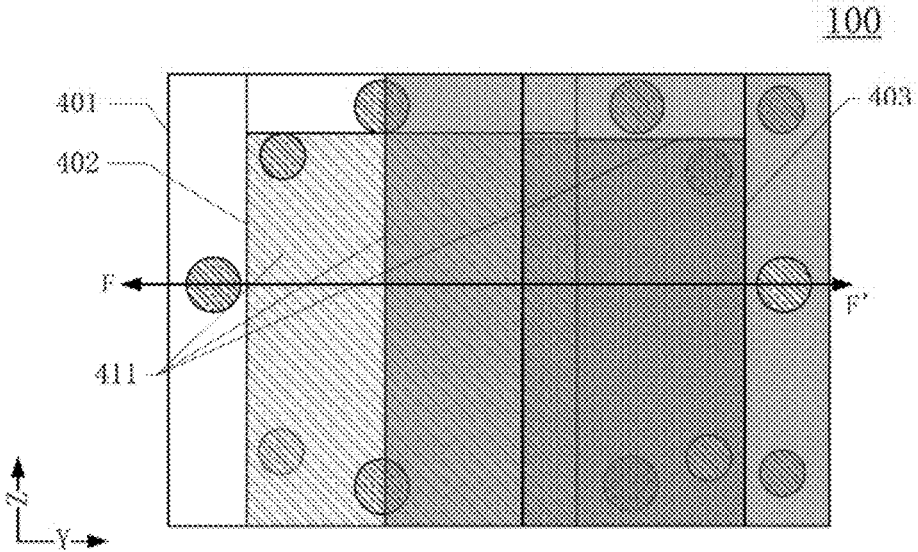
FIG. 11 is a schematic plan view of another display panel according to the present disclosure.
Figure 12:
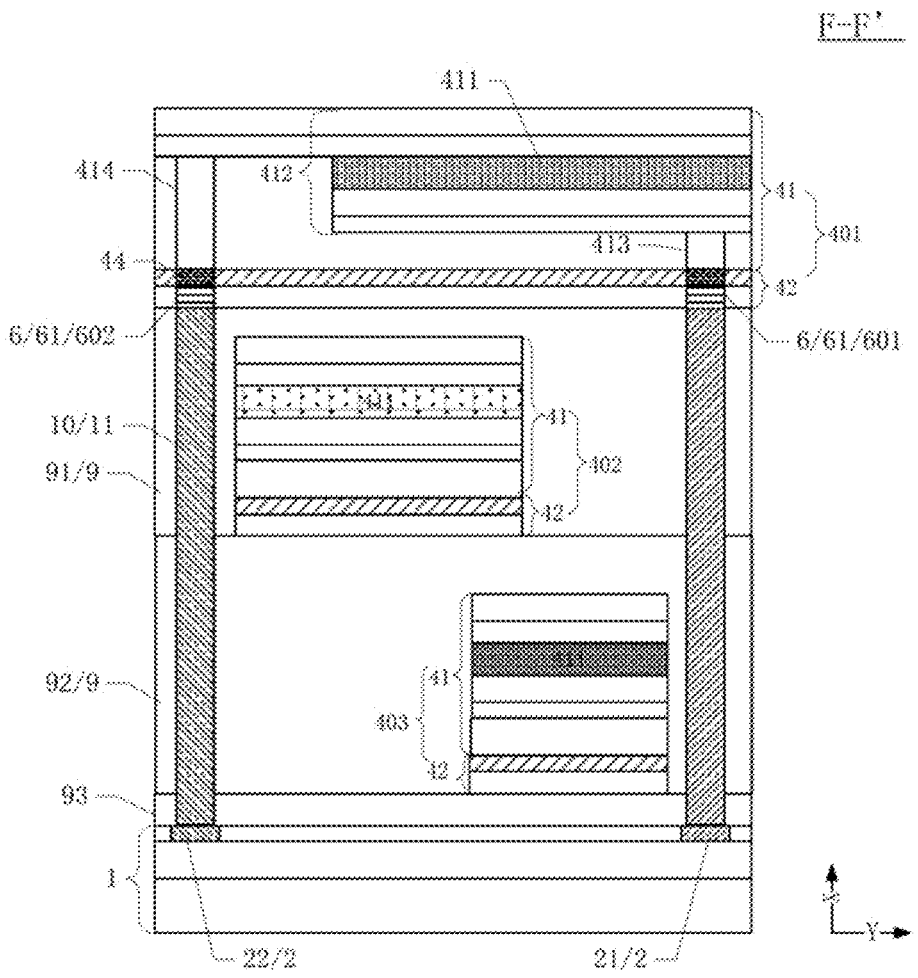
FIG. 12 is a cross-sectional view taken along F-F' in FIG. 11.
Figure 13:
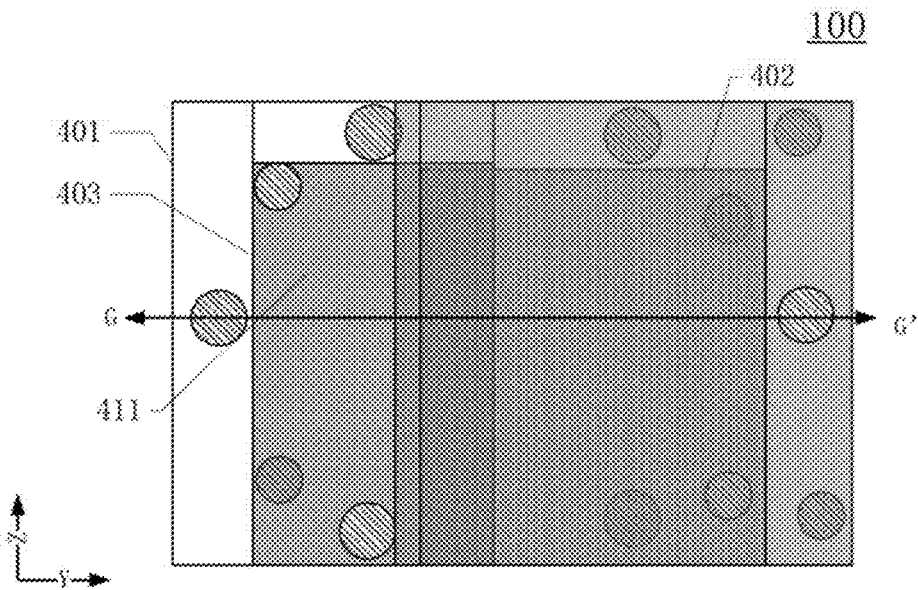
FIG. 13 is a schematic plan view of another display panel according to the present disclosure.
Figure 14:
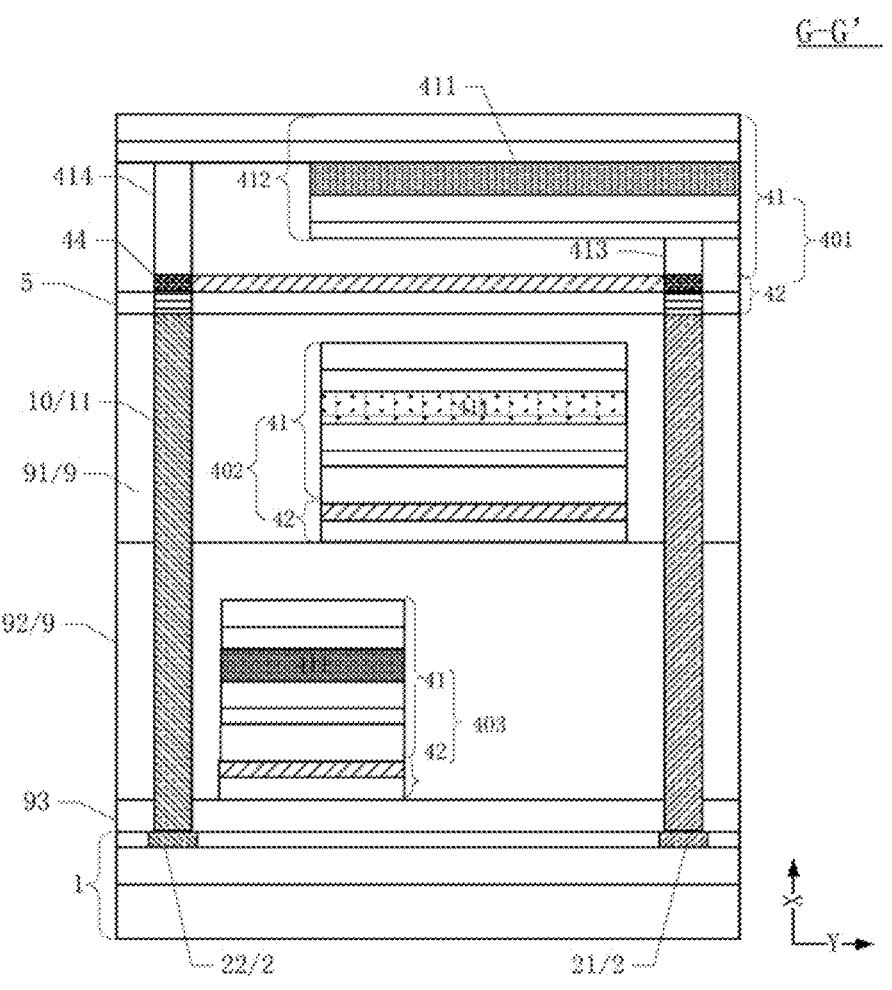
FIG. 14 is a cross-sectional view taken along G-G' in FIG. 13.

In some embodiments, referring to FIG. 11. FIG. 12, FIG. 13, and FIG. 14, FIG. 11 is a schematic plan view of another display panel according to the present disclosure, FIG. 12 is a cross-sectional view taken along F-F' in FIG. 11, FIG. 13 is a schematic plan view of another display panel according to the present disclosure, and FIG. 14 is a cross-sectional view taken along G-G' in FIG. 13. In FIG. 11 to FIG. 14, a first light-emitting chip 401, a second light-emitting chip 402, and a third light-emitting chip 403 are provided. An orthographic projection on a substrate 1 of a light-emitting material layer 411 of the second light-emitting chip 402 or an orthographic projection on a substrate 1 of a light-emitting material layer 411 of the third light-emitting chip 403 is at least partially non-overlapping with that of a light-emitting material layer 411 of the first light-emitting chip 401. In this case, at least part of exit light from the second light-emitting chip 402 or the third light-emitting chip 403 does not pass through the light-emitting material layer 411 of the first light-emitting chip 401. Thus a small impact is caused on the light from the second light-emitting chip 402 or the third light-emitting chip 403, and the light mixing effect is improved.

In some embodiments, with reference to FIG. 11 and FIG. 12, when the second light-emitting chip 402 is a blue light-emitting chip, the first light-emitting chip 401 may be a red light-emitting chip. In the direction perpendicular to the plane of the substrate 1, the light-emitting material layer 411 of the second light-emitting chip 402 is at least partially non-overlapping with the light-emitting material layer 411 of the first light-emitting chip 401. When the second light-emitting chip 402 is the blue light-emitting chip, the blue-light emitted from the blue light-emitting chip has high energy, and may cause excitation of the red light-emitting material and the green light-emitting material. The overlapping area between the light-emitting material layer 411 of the second light-emitting chip 402 and the light-emitting material layer 411 of the first light-emitting chip 401 can reduce the re-excitation of the light-emitting material 411 of the first light-emitting chip 401 caused by the blue light. In this case, the light-emitting material layer 411 of the third light-emitting chip 403 may overlap with the light-emitting material layer 411 of the first light-emitting chip 401, and re-excitation is not caused.

In some embodiments, with reference to FIG. 13 and FIG. 14, when the third light-emitting chip 403 is a blue light-emitting chip, in the direction perpendicular to the plane of the substrate 1, the light-emitting material layer 411 of the third light-emitting chip 403 is at least partially non-overlapping with both the light-emitting material layer 411 of the first light-emitting chip 401 and the light-emitting material layer 411 of the second light-emitting chip 402. Since the exit light from the blue light-emitting chip is blue and has high energy, the red light-emitting material and the green light-emitting material may be re-excited by the blue light. When the third light-emitting chip 403 is the blue light-emitting chip, its overlapping areas with the light-emitting material layer 411 of the first light-emitting chip 401 and the light-emitting material layer 411 of the second light-emitting chip 402 are reduced. As a result, the re-excitation of the light-emitting material layer 411 of the first light-emitting chip 401 and the light-emitting material layer 411 of the second light-emitting chip 402 caused by the blue light-emitting chip is reduced.

Figure 15:
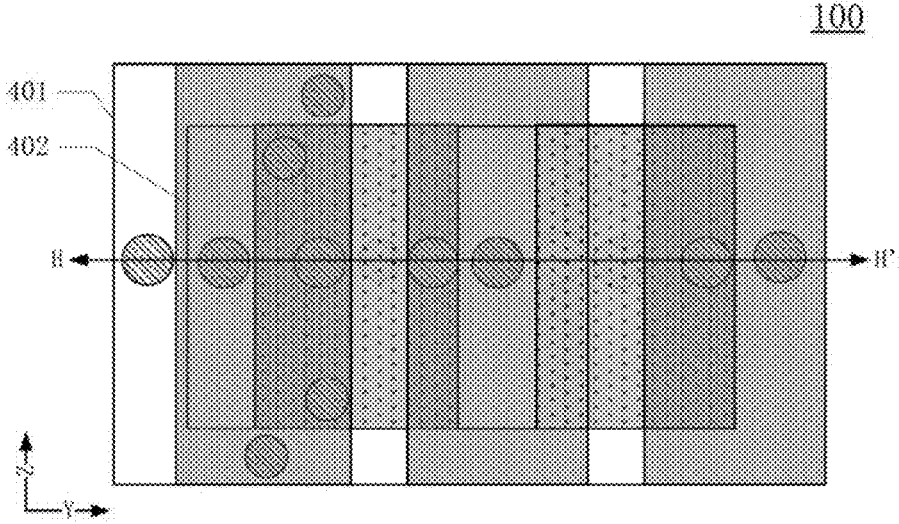
FIG. 15 is a schematic plan view of another display panel according to the present disclosure.
Figure 16:
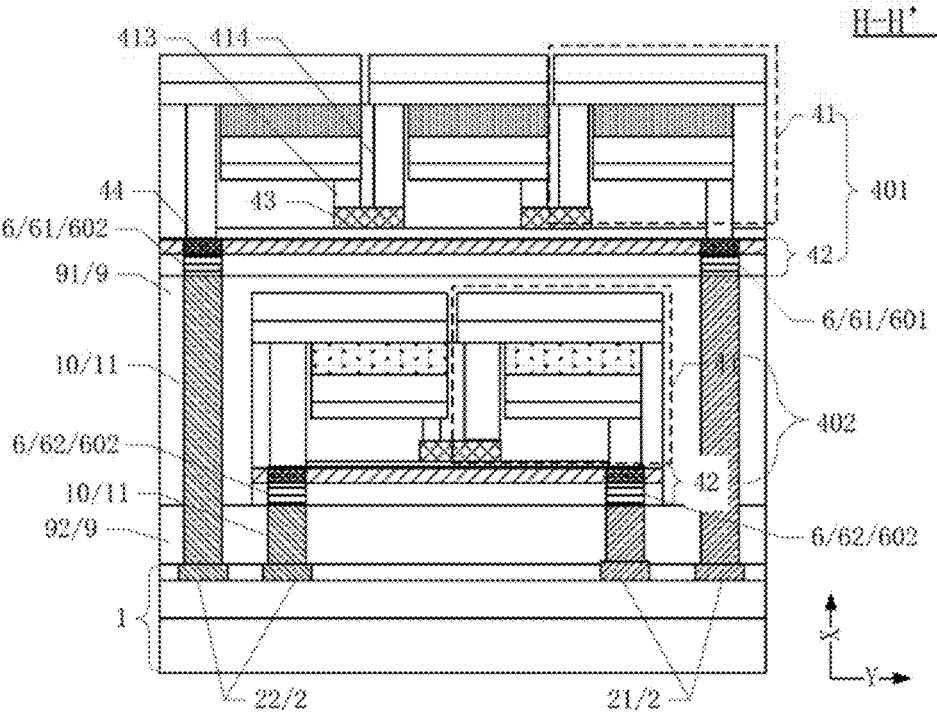
FIG. 16 is a cross-sectional view taken along H-H' in FIG. 15.

In some embodiments, referring to FIG. 15 and FIG. 16, FIG. 15 is a schematic plan view of another display panel according to the present disclosure, and FIG. 16 is a cross-sectional view taken along H-If in FIG. 15. A quantity of light-emitting elements 41 in a first light-emitting chip 401 is larger than a quantity of light-emitting elements 41 in a second light-emitting chip 402.

In FIG. 15 and FIG. 16, there are three light-emitting elements 41 in the first light-emitting chip 401, and there are two light-emitting elements 41 in the second light-emitting chip 402. This is only a schematic illustration, and the present disclosure is not limited thereto. In another embodiment of the present disclosure, there is one light-emitting element 41 in the third light-emitting chip 403, which is not shown in the figure.

In some embodiments, the light-emitting elements 41 in the first light-emitting chip 401 are connected in series and then connected to the driver circuit 42. As shown in FIG. 16, the multiple light-emitting elements 41 in the same light-emitting chip 4 may be connected through one or more wires 43. Taking the first light-emitting chip 401 as an example, a first electrode 414 of the first light-emitting element 41 is connected to a second electrode 413 of the second light-emitting element 41 through a wire 43, a first electrode 414 of the second light-emitting element 41 is connected to a second electrode 413 of the third light-emitting element 41 through another wire 43, and a second electrode 413 of the first light-emitting element 41 and a first electrode 414 of the third light-emitting element 41 are connected to the driver circuit 42. Taking the second light-emitting chip 402 as an example, a first electrode 414 of the first light-emitting element 41 is connected to a second electrode 413 of the second light-emitting element 41 through a wire 43, and a second electrode 413 of the first light-emitting element 41 and a first electrode 414 of the second light-emitting element 41 are electrically connected to the driver circuit 42. In some embodiments, the driver circuit 42 includes a plurality of bonding electrodes 44, and the first electrode 414 and the second electrode 413 are electrically connected to the bonding electrodes 44 respectively. The first electrode 414 and the second electrode 413 are not filled with patterns in the figure.

It is understood that in the first direction X, the light-emitting area of the first light-emitting chip 401 including light-emitting element connected in series is larger than that of the second light-emitting chip 402, which facilitates stacking. When the first light-emitting chip 401 and the second light-emitting chip 402 are connected to the substrate 1, wires can be reduced, so as to reduce the wiring space and further improve the resolution.

In some embodiments, still referring to FIG. 2, FIG. 3, FIG. 4, FIG. 6, FIG. 7, and FIG. 8, the driver circuit 42 includes a base 5, and the light-emitting chip 4 includes a connection portion 6 that penetrates through the base 5.

The connection portion 6 includes a first-type connection portion 61 and a second-type connection portion 62. The first light-emitting chip 401 is electrically connected to the signal line 2 via the first-type connection portion 61, and the second light-emitting chip 402 is electrically connected to the signal line 2 via the second-type connection portion 62.

In a direction perpendicular to the plane of the substrate 1, the first-type connection portion 61 is at least partially non-overlapping with the second-type connection portion 62.

As shown in FIG. 2 to FIG. 5, the first light-emitting chip 401 and the second light-emitting chip 402 both have the connection portion 6, the connection portion 6 of the first light-emitting chip 401 is the first-type connection portion 61 and the connection portion 6 of the second light-emitting chip 402 is the second-type connection portion 62. In some embodiments, the connection portion 6 further includes a third type connection portion 63. As shown in FIG. 6 to 8, the third light-emitting chip 403 is electrically connected to the signal line 2 via the third type connection portion 63. In the direction perpendicular to the plane of the substrate 1, the third type connection portion 63, the first-type connection portion 61, and the second-type connection portion 62 are at least partially non-overlapping.

In the present disclosure, the first-type connection portion 61 is electrically connected to the signal line 2 of the substrate 1, and the second-type connection portion 62 is electrically connected to the signal line 2 of the substrate 1. If the first-type connection portion 61 overlaps with the second-type connection portion 62, it is necessary to provide a wire in the driver circuit 42 of the first light-emitting chip 401 to electrically connect the first-type connection portion 61 to the substrate 1, or it is necessary to provide a wire in the driver circuit 42 of the second light-emitting chip 402 to electrically connect the second-type connection portion 62 to the substrate 1. In a direction parallel to the plane of the substrate 1, the wires occupy some space, which will reduce the resolution. However, in the present disclosure, in the direction perpendicular to the plane of the substrate 1, the first-type connection portion 61 is at least partially non-overlapping with the second-type connection portion 62, such that the first-type connection portion 61 can be directly electrically connected to the signal line 2 along the first direction X, and the second-type connection portion 62 can also be directly electrically connected to the signal line 2 along the first direction X. There is no need to provide wires in the driver circuit 42, which can save the space and further improve the resolution. Certainly, wiring increases the complexity of the manufacturing process and the production cost, and the present disclosure does not need to provide the wires, which can reduce the process complexity and reduce the production cost.

In some embodiments, in the direction perpendicular to the plane of the substrate 1, the third type connection portion 63, the first-type connection portion 61, and the second-type connection portion 62 are at least partially non-overlapping, which can further save the space and improve the resolution. The first-type connection portion 61 is electrically connected to the signal line 2 of the substrate 1, the second-type connection portion 62 is electrically connected to the signal line 2 of the substrate 1, and the third type connection portion 63 is electrically connected to the signal line 2 of the substrate 1. If the first-type connection portion 61 overlaps with the second-type connection portion 62, it is necessary to provide a wire in the driver circuit 42 of the first light-emitting chip 401 to electrically connect the first-type connection portion 61 to the substrate 1, or it is necessary to provide a wire in the driver circuit 42 of the second light-emitting chip 402 to electrically connect the second-type connection portion 62 to the substrate 1, or it is necessary to provide a wire in the driver circuit 42 of the third light-emitting chip 403 to electrically connect the third type connection portion 63 to the substrate 1. In the direction parallel to the plane of the substrate 1, the wires occupy some space, which will reduce the resolution. However, in the present disclosure, in the direction perpendicular to the plane of the substrate 1, the third type connection portion 63, the first-type connection portion 61, and the second-type connection portion 62 are at least partially non-overlapping, such that the first-type connection portion 61 can be directly electrically connected to the signal line 2 along the first direction X, the second-type connection portion 62 can also be directly electrically connected to the signal line 2 along the first direction X, and the third type connection portion 63 can also be directly electrically connected to the signal line 2 along the first direction X. There is no need to provide wires in the driver circuit 42, which can save space and further improve the resolution. Moreover, this can reduce the process complexity and reduce the production cost.

Figure 17:
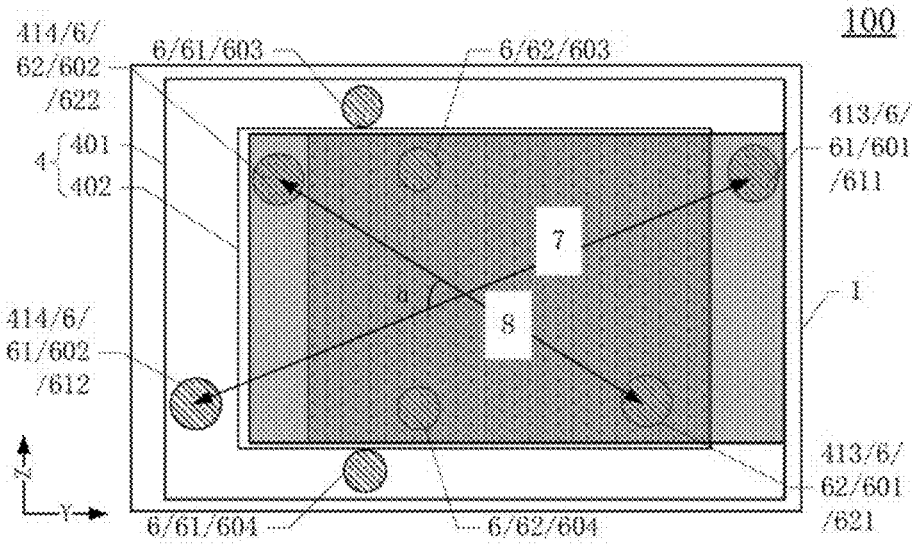
FIG. 17 is a schematic plan view of another display panel according to the present disclosure.

In some embodiments, referring to FIG. 17, FIG. 17 is a schematic plan view of another display panel according to the present disclosure. The first-type connection portion 61 includes a first connection portion 611 and a second connection portion 612, and a virtual line connecting the first connection portion 611 and the second connection portion 612 is a first connection line 7. The second-type connection portion 62 includes a third connection portion 621 and a fourth connection portion 622, and a virtual line connecting the third connection portion 621 and the fourth connection portion 622 is a second connection line 8. The angle between the first connection line 7 and the second connection line 8 is α, and 0<α<90°.

In FIG. 17, two connection portions 6 in the first-type connection portion 61 are the first connection portion 611 and the second connection portion 612, and the connection line between the first connection portion 611 and the second connection portion 612 is the first connection line 7, two connection portions 6 in the second-type connection portion 62 are the third connection portion 621 and the fourth connection portion 622, and the connection line between the third connection portion 621 and the fourth connection portion 622 is the second connection line 8. This is of course merely a schematic illustration. For example, the signals on the first connection portion 611 and the third connection portion 621 are the same, the signals on the second connection portion 612 and the fourth connection portion 622 are the same, and the angle α between the first connection line 7 and the second connection line 8 is between 0° and 90°, that is, the angle between the first connection line 7 and the second connection line 8 is an acute angle, as shown in FIG. 17. This is of course only a schematic illustration, and there may be other arrangements. In this case, orthographic projections of the first connection portion 611 and the third connection portion 621 on the substrate 1 are far from each other, and orthographic projections of the second connection portion 612 and the fourth connection portion 622 on the substrate 1 are far from each other. The first connection portion 611 is electrically connected to the substrate 1 by means of a conductive portion 11 in a via structure 10 (not shown in the figure), and the third connection portion 621 is electrically connected to the substrate 1 by means of a conductive portion 11 in another via structure 10. A distance between the via structures 10 is large, which does not cause crosstalk. Similarly, the second connection portion 612 is electrically connected to the substrate 1 by means of a conductive portion 11 in a via structure 10, and the fourth connection portion 622 is electrically connected to the substrate 1 by means of a conductive portion 11 in another via structure 10. A distance between the via structures 10 is large, which does not cause crosstalk.

In some embodiments, as shown in FIG. 2, the first-type connection portion 61 includes a first connection portion 611 and a second connection portion 612, and the connection line between the first connection portion 611 and the second connection portion 612 is the first connection line 7, the second-type connection portion 62 includes a third connection portion 621 and a fourth connection portion 622, and the connection line between the third connection portion 621 and the fourth connection portion 622 is the second connection line 8. The first connection line 7 is parallel to the second connection line 8. In this case, the first connection portion 611, the second connection portion 612, the third connection portion 621, and the fourth connection portion 622 are all in a straight line in a plan view, and the via structures 10 corresponding thereto are also in a straight line in the plan view, which is more convenient for forming the via structures 10.

In some embodiments, still referring to FIG. 3, FIG. 4, FIG. 7. FIG. 8, FIG. 10, FIG. 11, FIG. 12, FIG. 14, and FIG. 16, the display panel includes a planarization layer 9 located between the light-emitting chip 4 and the substrate 1. The planarization layer 9 includes the via structures 10, and the connection portions 6 of the light-emitting element group are electrically connected to the signal lines 2 of the substrate 1 via the conductive portions 11 in the via structures 10. In the first direction X, the conductive portion 11 at least partially overlaps with the connection portion 6.

It is to be understood that the planarization layer 9 between the light-emitting chip 4 and the substrate 1 has a function of planarization as well as supporting the first light-emitting chip 401 and the second light-emitting chip 402, and it can also provide insulation, to prevent short circuit between the first light-emitting chip 401 and the second light-emitting chip 402. Certainly, a third planarization layer 93 is provided between the third light-emitting chip 403 and the substrate.

The via structure 10 may be formed in the planarization layer 9 by selectively etching the planarization layer 9 to form a hole, the hole structure 10 penetrates through the planarization layer 9 along the first direction X, and the conductive portion 11 is formed in the via structure 10. In the first direction X, an end of the conductive portion 11 is electrically connected to the connection portion 6 in the light-emitting chip 4, and the other end is electrically connected to the signal line 2 on the substrate 1, thereby realizing signal transmission. For example, a strobe signal is transmitted from a scanning line 24 to the conductive portion 11, the conductive portion 11 transmits the strobe signal to the connection portion 6, and then the connection portion 6 transmits the strobe signal to the driver circuit 42, which starts the driving phase. In some embodiments, the conductive portion 11 may be made of the same metal material as the signal line 2 connected to the conductive portion 11. On the one hand, the conductibility is good. On the other hand, the metal material is easy to obtain. For example, the conductive portion 11 electrically connected to a first power signal line 21 may be made of the same material as the first power signal line 21, and the conductive portion 11 electrically connected to the scanning line 24 may be made of the same material as the scanning line 24.

In the present disclosure, along the first direction X, the conductive portion 11 at least partially overlaps with the connection portion 6, which can ensure the reliability of electrical connection between the conductive portion 11 and the connection portion 6 and ensure the reliability of signal transmission.

In some embodiments, still referring to FIG. 3, along the first direction X, the first light-emitting chip 401 is farthest from the substrate 1, followed by the second light-emitting chip 402, and the third light-emitting chip 403 is closest to the substrate 1. The conductive portion 11 connected to the first light-emitting chip 401 has a height h1 (not labeled in the figure) along the first direction X, the conductive portion 11 connected to the second light-emitting chip 402 has a height h2 (not labeled in the figure) along the first direction X, the conductive portion 11 connected to the third light-emitting chip 403 has a height h3 (not labeled in the figure) along the first direction X, and h1>h2>h3, ensuring the reliability of the electrical connection between each light-emitting chip 4 and the substrate 1.

In some embodiments, still referring to FIG. 3, an orthographic projection of the via structure 10 corresponding to the first light-emitting chip 401 on the plane of the substrate 1 has an area S1 (not labeled in the figure), an orthographic projection of the via structure 10 corresponding to the second light-emitting chip 402 on the plane of the substrate 1 has an area S2 (not labeled in the figure), and an orthographic projection of the via structure 10 corresponding to the third light-emitting chip 403 on the plane of the substrate 1 has an area S3 (not labeled in the figure). In some embodiments, S1>S2>S3. Along the first direction X, since the first light-emitting chip 401 is farthest from the substrate 1, followed by the second light-emitting chip 402, and the third light-emitting chip 403 is closest to the substrate 1, and S1>S2>S3, the reliability of connection between the conductive portion 11 in the via structure 10 and the substrate 1 can be ensured.

In some embodiments, still referring to FIG. 3, the planarization layer 9 includes a first planarization layer 91 and a second planarization layer 92. In the first direction X, the first planarization layer 91 is at least partially located between the first light-emitting chip 401 and the second light-emitting chip 402, the first planarization layer 91 includes a first via structure 101, the second planarization layer 92 is at least partially located between the second light-emitting chip 402 and the substrate 1, and the second planarization layer 92 includes a second via structure 102. The first via structure 101 at least partially overlaps with the second via structure 102 in the first direction X.

The planarization layer 9 includes the first planarization layer 91 and the second planarization layer 92. In the first direction X, the first planarization layer 91 is at least partially located between the first light-emitting chip 401 and the second light-emitting chip 402, the first planarization layer 91 includes the first via structure 101, the second planarization layer 92 is at least partially located between the second light-emitting chip 402 and the substrate 1, and the second planarization layer 92 includes the second via structure 102. A plurality of second via structures 102 are shown in the figure. A conductive portion 11 in a second via structure 1022 is used to electrically connect the first light-emitting chip 401 to the substrate 1, and a conductive portion 11 in a second via structure 1021 is used to electrically connect the second light-emitting chip 402 to the substrate 1. Along the first direction X, the first via structure 101 at least partially overlaps with the second via structure 1022, the conductive portion 11 electrically connected to the connection portion 6 of the driver circuit 42 in the first light-emitting chip 401 is disposed in the first via structure 101 and the second via structure 1022, and the conductive portion 11 electrically connected to the connection portion 6 of the driver circuit 42 in the second light-emitting chip 402 is disposed in the second via structure 1021. Because the first light-emitting chip 401 is farther from the substrate 1, the via structure 10 is divided into two parts along the first direction X, namely, the first via structure 101 and the second via structure 1022. This can reduce the depth of the via structure 10 formed in one etch step and prevent the hole from being formed too deep unable to be electrically connected to the signal line 2. Certainly, when forming the via structure 10 by two etch steps, in the first direction X, the first via structure 101 at least partially overlaps with the second via structure 102, which can ensure the reliability of the alignment of the first via structure 101 and the second via structure 1021.

Figure 19:
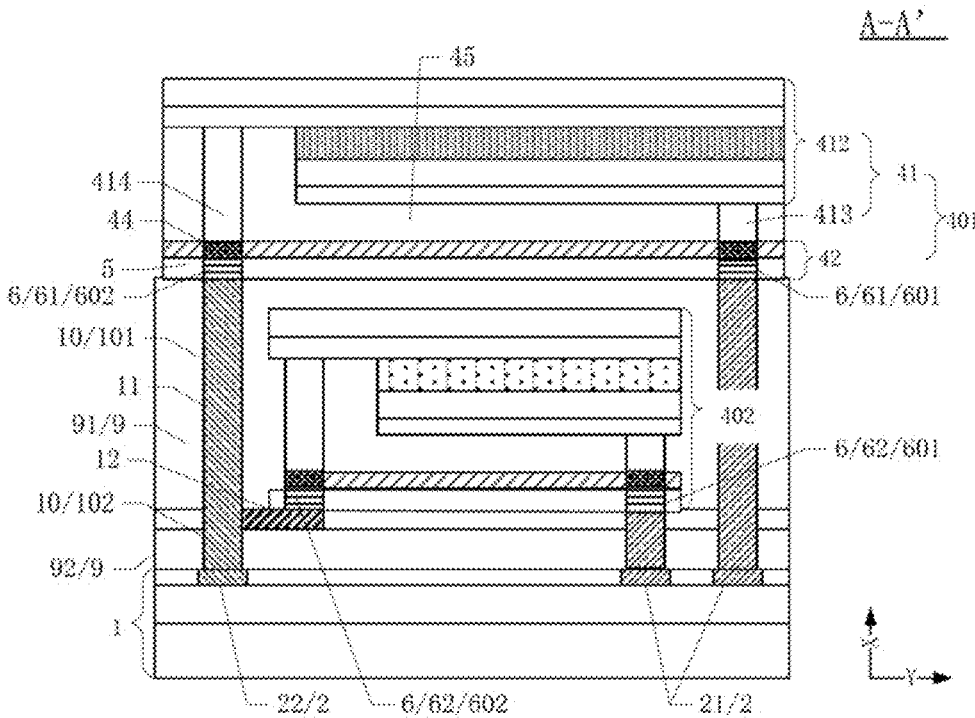
FIG. 19 is another cross-sectional view taken along A-A' in FIG. 2.

In some embodiments, referring to FIG. 19, FIG. 19 is another cross-sectional view taken along A-A' in FIG. 2. A first wire is provided at a side of the second planarization layer 92 away from the substrate 1, a first end of the first wire is connected to a first electrode 414 of the light-emitting element 41 in the second light-emitting chip 402, and a second end of the first wire is connected to the conductive portion 11 in the second via structure 102.

It is to be understood that the first wire is located at a side of the second planarization layer 92 away from the substrate 1. In some embodiments, the first wire is electrically connected to the second-type connection portion 62 penetrating through the base 5 of the driver circuit 42. An end of the first wire is electrically connected to the first electrode 414 of the light-emitting element 41 via the second-type connection portion 62, and the other end of the first wire is electrically connected to the conductive portion 11 in the second via structure 102. The conductive portion 11 in the second via structure 102 is used to connect the driver circuit 42 of the first light-emitting chip 401 to the signal line 2 on the substrate 1. Therefore, it is not needed to arrange a conductive portion for electrically connecting the second light-emitting chip 402 to the substrate 1. In this case, the first light-emitting chip 401 and the second light-emitting chip 402 transmit the same electrical signal. For example, the power voltages transmitted to the first light-emitting chip 401 and the second light-emitting chip 402 are both low voltages. On the one hand, the first electrode 414 of the second light-emitting chip 402 does no need a corresponding conductive portion 11, and the via structure 10 formed in correspondence with the first light-emitting chip 401 can be used for the second light-emitting chip 402. Therefore, the manufacturing process can be simplified.

Figure 20:
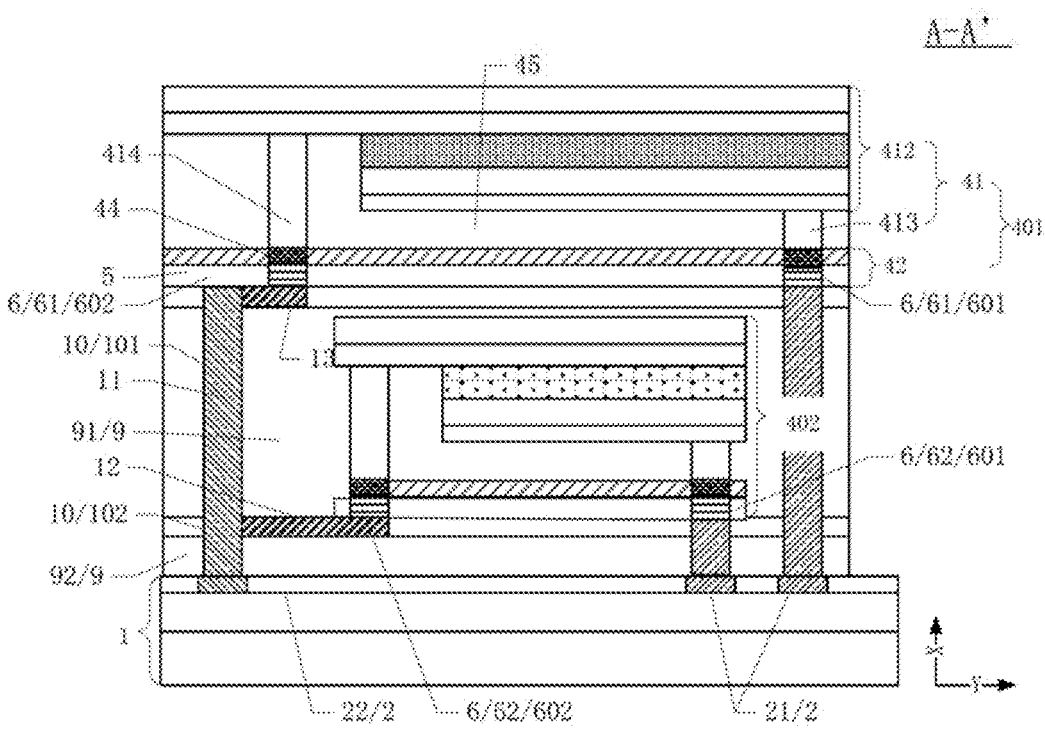
FIG. 20 is another cross-sectional view taken along A-A' in FIG. 2.

In some embodiments, referring to FIG. 20, FIG. 20 is another cross-sectional view taken along A-A' in FIG. 2. The first planarization layer 91 includes a second wire 13 at a side away from the substrate 1, a first end of the second wire 13 is connected to the first electrode 414 of the light-emitting element 41 in the first light-emitting chip 401, and a second end of the second wire 13 is connected to the conductive portion 11 in the first via structure 101. In this case, along the first direction X, part of the connection portions 6 of the first light-emitting chip 401 do not overlap the conductive portion 11 in the first via structure 101, the second wire is needed to electrically connect the connection portion 6 to the conductive portion 11. Certainly, in the structure, the first via structure 101 and the second via structure 102 each are provided the the conductive portion 11 therein. The first electrode 414 of the second light-emitting chip 402 does not need a corresponding conductive portion 11, and the via structure 10 formed in correspondence with the first light-emitting chip 401 can be used for the second light-emitting chip 402. Therefore, the manufacturing process can be simplified.

In some embodiments, still referring to FIG. 3, the conductive portions 11 include a first-type conductive portion 111, and the first light-emitting chip 401 is electrically connected to the signal line 2 of the substrate 1 via the first-type conductive portion 111.

The first-type conductive portion 111 includes a first conductive portion 1111 and a second conductive portion 1112. In a direction parallel to the plane of the substrate 1, the second light-emitting chip 402 is disposed between the first conductive portion 1111 and the second conductive portion 1112.

The first light-emitting chip 401 is electrically connected to the signal line 2 of the substrate 1 via the first-type conductive portion 111, and the first-type conductive portion 11 may include the first conductive portion 1111 and the second conductive portion 1112. In this embodiment, along the second direction Y, the second light-emitting chip 402 is located between the first conductive portion 1111 and the second conductive portion 1112. In the first light-emitting chip 401, the connection portion 6 of the driver circuit 42 is electrically connected to the substrate 1 through the conductive portion 11 such that the signal in the substrate 1 is transmitted to the driver circuit 42. Therefore, the position of the conductive portion 11 determines the area of the light-emitting material layer 411 in the first light-emitting chip 401. To ensure sufficient area of the light-emitting material layer 411 in the first light-emitting chip 401, it is necessary to provide the conductive portion 11 at a position close the edge of the first light-emitting chip 401. In the present disclosure, the area of the first light-emitting chip 401 is larger than that of the second light-emitting chip 402. Therefore, along the direction parallel to the plane of the substrate 1, the second light-emitting chip 402 is located between the first conductive portion 1111 and the second conductive portion 1112, and the position of the conductive portion 11 corresponding to the first light-emitting chip 401 can ensure sufficient area of the light-emitting material layer 411.

In some embodiments, the conductive portion 11 may be made of metal, and the metal is reflective. It can be understood that light emitted by the light-emitting chip 4 not only includes light in the first direction X, but also includes light in a large viewing angle, but the light emitted in a large viewing angle cannot be utilized. In the present disclosure, along the direction parallel to the plane of the substrate 1, the second light-emitting chip 402 is located between the first conductive portion 1111 and the second conductive portion 1112, and can take advantage of the reflective property of the metal materials of the first conductive portion 1111 and the second conductive portion 1112. When light of the second light-emitting chip 402 exits at a large angle and is incident on the first conductive portion III or the second conductive portion 1112, the surface of the first conductive portion 1111 or the second conductive portion 1112 reflects the light to a light exit surface of the light-emitting element group 3, increasing the exit light amount.

In some embodiments, referring to FIG. 7, the conductive portion 11 includes a second-type conductive portion 112, and the second light-emitting chip 402 is electrically connected to the signal line 2 of the substrate 1 via the second-type conductive portion 112. The second-type conductive portion 112 includes a third conductive portion 1121 and a fourth conductive portion 1122. Along a direction parallel to the plane of the substrate 1, the third light-emitting chip 403 is disposed between the third conductive portion 1121 and the fourth conductive portion 1122, and can take advantage of the reflective property of the metal materials of the third conductive portion 1121 and the fourth conductive portion 1122. When light of the third light-emitting chip 403 exits at a large angle and is incident on the third conductive portion 1121 or the fourth conductive portion 1122, the surface of the third conductive portion 1121 or the fourth conductive portion 1122 reflects the light to the light exit surface of the light-emitting element group 3, increasing the exit light amount.

Figure 21:
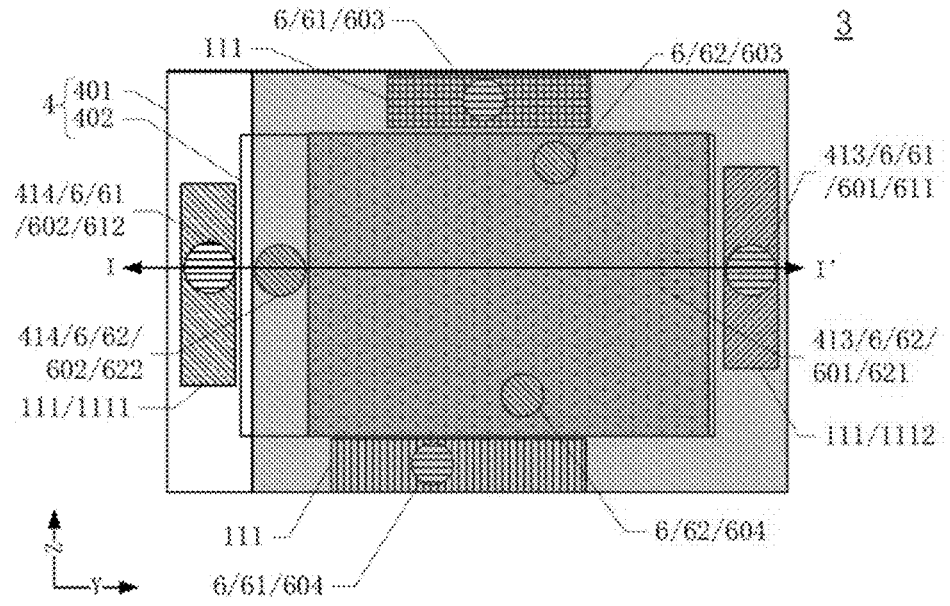
FIG. 21 is a schematic plan view of another display panel according to the present disclosure.
Figure 22:
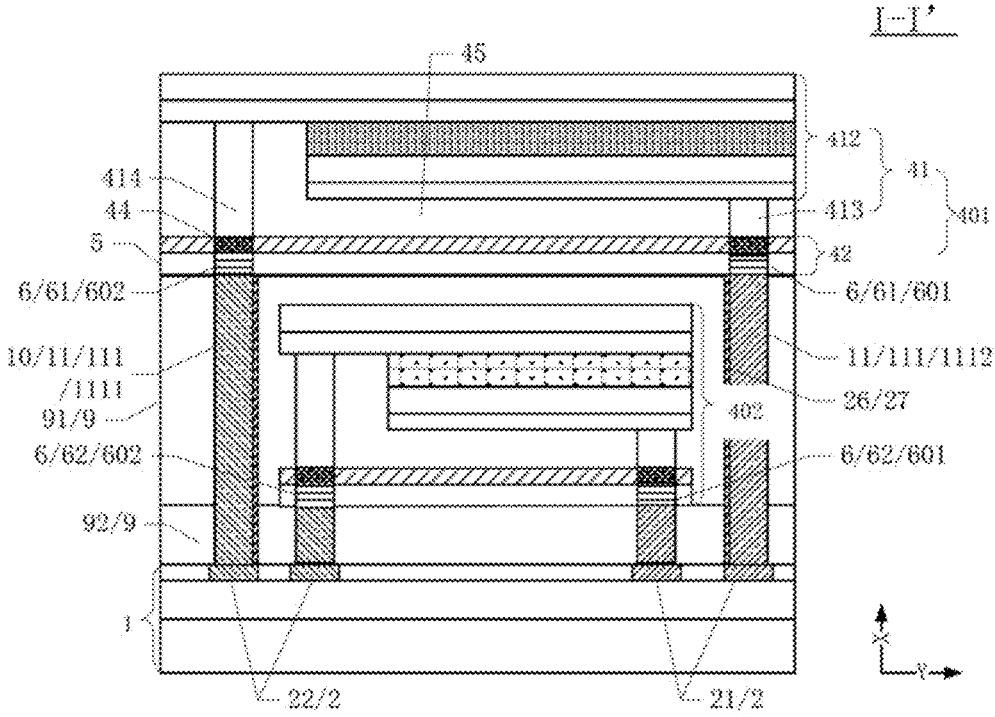
FIG. 22 is a cross-sectional view taken along I-I' in FIG. 21.

In some embodiments, referring to FIG. 21 and FIG. 22, FIG. 21 is a schematic plan view of another display panel according to the present disclosure, and FIG. 22 is a cross-sectional view taken along I-I' in FIG. 21. The first-type conductive portion 111 includes a reflective surface 26 facing the second light-emitting chip 402.

The first-type conductive portion 111 includes the reflective surface 26 facing the second light-emitting chip 402, that is, the first-type conductive portion 111 is coated with a reflective material layer in at least the direction parallel to the plane of the base. FIG. 22 shows only for illustration that the first-type conductive portion 111 includes the reflective material layer 27 facing the second light-emitting chip 402. The first-type conductive portion 111 includes the reflective surface 26 facing the second light-emitting chip 402. When light emitted by the second light-emitting chip 402 at a large angle is incident on the first conductive portion 1111 or the second conductive portion 1112, the surface of the first conductive portion 111 or the second conductive portion 1112 reflects the light to the light exit surface of the light-emitting element group 3, increasing the exit light amount.

In some embodiments, the first conductive portion 1111 and the second conductive portion 1112 may be a cylinder, increasing the area of the surface facing the second light-emitting chip 402. As shown in FIG. 21, light emitted by the second light-emitting chip 402 at a large angle can be reflected as much as possible by the first conductive portion 1111 and the second conductive portion 1112, further increasing the exit light amount.

In some embodiments, still referring to FIG. 2 to FIG. 4, as shown in FIG. 2, the driver circuit 42 includes a base 5, and the light-emitting chip 4 includes a connection portion 6 penetrating through the base 5. The connection portion 6 includes a first power signal connection portion 601 and a second power signal connection portion 602 for transmitting power signals, and the first power signal connection portion 601 and the second power signal connection portion 602 are arranged along the second direction Y. The connection portion 6 further includes a data signal connection portion 603 for transmitting a data signal and a strobe signal connection portion 604 for transmitting an enable signal, and the data signal connection portion 603 and the strobe signal connection portion 604 are arranged along the third direction Z. The second direction Y and the third direction Z are parallel to the plane of the substrate 1, and the second direction Y intersects the third direction Z.

As shown in FIG. 2, the first power signal connection portion 601 and the second power signal connection portion 602 are arranged along the second direction Y, the data signal connection portion 603 and the strobe signal connection portion 604 are arranged along the third direction Z, and the second direction Y intersects the third direction Z. In this way, the first power signal connection portion 601, the second power signal connection portion 602, the data signal connection portion 603 and the strobe signal connection portion 604 can be arranged in different positions of the driver circuit 42, rationally utilizing the space of the driver circuit 42. In addition, the first power signal connection portion 601, the second power signal connection portion 602, the data signal connection portion 603, and the strobe signal connection portion 604 each need to be electrically connected to the substrate 1 through the corresponding conductive portion 11, so as to rationally set the positions of the via structures 10.

As shown in FIG. 3 and FIG. 4, the first power signal connection portion 601 is electrically connected to the first power voltage signal line 2 through the first-type conductive portion 111, and the first power signal connection portion 601 is further electrically connected to the second electrode 413 of the light-emitting element 41 through the bonding electrode 44. The second power signal connection portion 602 is electrically connected to the second power voltage signal line 2 through another first-type conductive portion 111, and the second power signal connection portion 602 is further electrically connected to the first electrode 414 of the light-emitting element 41 through another bonding electrode 44. The power voltage of the first power voltage signal line 2 is transmitted to the first power signal connection portion 601, and then transmitted to the second electrode via the bonding electrode 44. The power voltage of the second power voltage signal line 2 is transmitted to the second power signal connection portion 602, and then transmitted to the first electrode via the bonding electrode 44. The data signal connection portion 603 is electrically connected to the data line 23 via the first-type conductive portion 111, the strobe signal connection portion 604 is electrically connected to the scanning line 24 via another first-type conductive portion 111, the data signal connection portion 603 is used for transmitting a data signal, and the strobe signal connection portion 604 is used for transmitting an enable signal.

Figure 23:
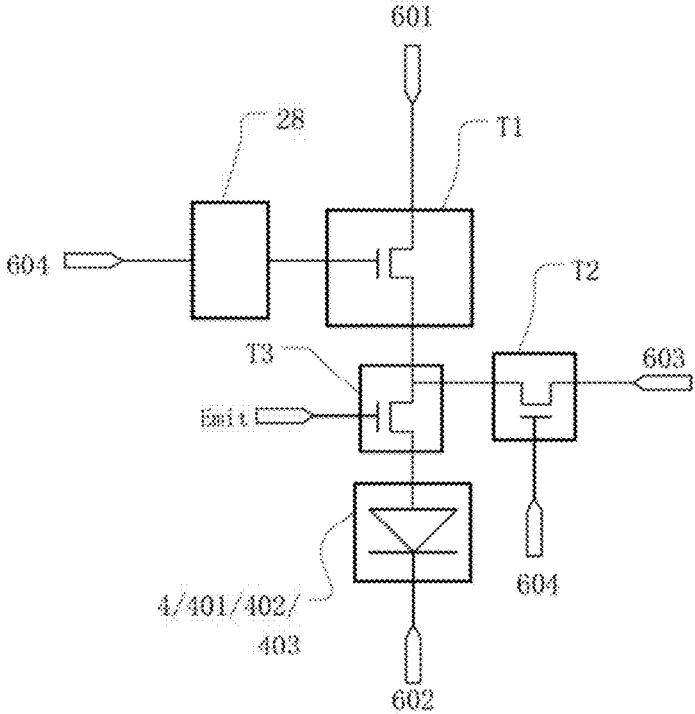
FIG. 23 is a circuit diagram of a driver circuit according to the present disclosure.
Figure 24:
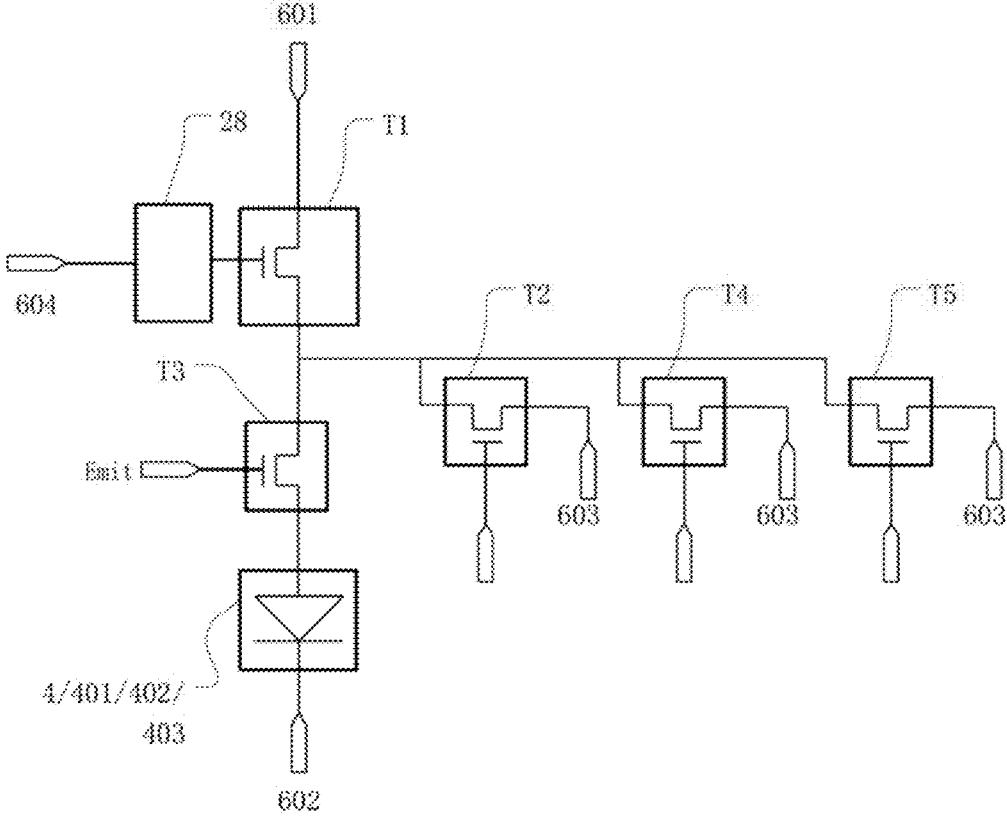
FIG. 24 is a circuit diagram of another driver circuit according to the present disclosure.

For the circuit diagram of the driver circuit 42, refer to FIG. 23 and FIG. 24. FIG. 23 is a circuit diagram of a driver circuit according to the present disclosure, and FIG. 24 is a circuit diagram of another driver circuit according to the present disclosure. It can be understood that driver circuit in FIG. 23 and FIG. 24 is only schematically illustrated, and the circuit in the driver circuit 42 may further include components such as a light-emitting control circuit and a reset circuit, which are not shown herein.

The circuits shown in FIG. 23 are electrically connected to the light-emitting chips 4 in a one-to-one correspondence. A strobe signal is inputted to a gate of a driver transistor T1 through the strobe signal connection portion 604 when a compensation circuit 28 is conducted. The compensation circuit 28 compensates for the gate potential of the driver transistor T1. The driver transistor T1 is conducted to generate a drive current. A data signal is inputted to the second electrode 413 of the light-emitting element 41 through the data signal connection portion 603 when a second transistor T2 and a third transistor T3 are turned on. The drive current is transmitted from the first power signal connection portion 601 to the second electrode 413 of the light-emitting element 41. The second power signal connection portion 602 may be connected to a low potential, and the light-emitting element 41 emits light. In the embodiment of FIG. 23, the first light-emitting chip 401, the second light-emitting chip 402, and the third light-emitting chip 403 are driven separately, such that light mixing can be realized.

In the embodiment of FIG. 24, the driver circuit drives all of the first light-emitting chip 401, the second light-emitting chip 402, and the third light-emitting chip 403. The strobe signal is inputted to the gate of the driver transistor T1 through the strobe signal connection portion 604 when the compensation circuit 28 is conducted, and the driver transistor T1 is turned on and generates the drive current. The first light-emitting chip 401 emits light when the second transistor T2 and the third transistor T3 are turned on. The second light-emitting chip 402 emits light when the fourth transistor T4 and the third transistor T3 are turned on. The third light-emitting chip 403 emits light when the fifth transistor $T_5$ and the third transistor T3 are turned on. The first light-emitting chip 401, the second light-emitting chip 402, and the third light-emitting chip 403 are driven at different times. However, this cannot be visually recognized due to the high refreshment frequency of the display panel. In the embodiment of FIG. 24, the compensation circuit 28 is shared to simplify the driver circuit 42.

Referring to FIG. 2, in the first light-emitting chip 401, the distance between the first power signal connection portion 601 and the second power signal connection portion 602 is P1, and the distance between the data signal connection portion 603 and the strobe signal connection portion 604 is P3. In the second light-emitting chip 402, the distance between the first power signal connection portion 601 and the second power signal connection portion 602 is P2, and the distance between the data signal connection portion 603 and the strobe signal connection portion 604 is P4. In some embodiments, P1−P2=P3−P4. In this way, the first power signal connection portion 601, the second power signal connection portion 602, the data signal connection portion 603, and the strobe signal connection portion 604 are more uniformly distributed, which is convenient for disposing the via structures 10 and electrically connecting the via structures 10 to the connection portions 6.

Referring to FIG. 6, in the first light-emitting chip 401, the distance between the first power signal connection portion 601 and the second power signal connection portion 602 is P1, and the distance between the data signal connection portion 603 and the strobe signal connection portion 604 is P3. In the second light-emitting chip 402, the distance between the first power signal connection portion 601 and the second power signal connection portion 602 is P2, and the distance between the data signal connection portion 603 and the strobe signal connection portion 604 is P4. In the third light-emitting chip 403, the distance between the first power signal connection portion 601 and the second power signal connection portion 602 is P5, and the distance between the data signal connection portion 603 and the strobe signal connection portion 604 is P6. In some embodiments, P1−P2=P2−P5, and P3−P4=P4−P6. In this way, the first power signal connection portion 601, the second power signal connection portion 602, the data signal connection portion 603, and the strobe signal connection portion 604 are more uniformly distributed, which is convenient for disposing the via structures 10 and electrically connecting the via structures 10 to the connection portions 6.

In some embodiments, still referring to FIG. 2 and FIG. 21, along the second direction Y, at least one of the data signal connection portion 603 and the strobe signal connection portion 604 is located between the first power signal connection portion 601 and the second power signal connection portion 602.

FIGS. 2 and 21 show that both the data signal connection portion 603 and the strobe signal connection portion 604 are located between the first power signal connection portion 601 and the second power signal connection portion 602 along the second direction Y, that is, the first power signal connection portion 601 and the second power signal connection portion 602 are disposed at the periphery of the light-emitting chip 4, which can maximize the area of the light-emitting material layer 411 and increase the exit light amount.

With reference to FIG. 21 and FIG. 22, the conductive portion 11 electrically connected to the first power signal connection portion 601 and the conductive portion 11 electrically connected to the second power signal connection portion 602 of the first light-emitting chip 401 are also used as reflective structures. For example, the conductive portions 11 respectively connected to the first power signal connection portion 601 and the second power signal connection portion 602 each have a rectangular orthographic projection on the plane of the substrate 1, and the area of the orthographic projection of the conductive portion 11 on the substrate 1 is increased. In some embodiments, the area of the surface of the conductive portion 11 facing the second light-emitting chip 402 is increased. On the one hand, the area of the orthographic projection of each of the conductive portions 11 respectively electrically connected to the first power signal connection portion 601 and the second power signal connection portion 602 on the substrate 1 is increased, so as to reduce the voltage drop of the power voltage. On the other hand, each of the conductive portions 11 respectively electrically connected to the first power signal connection portion 601 and the second power signal connection portion 602 is also used as the reflective structure, such that the area for reflection is larger, which facilitates reflecting the exit light from the second light-emitting chip 402.

Figure 25:
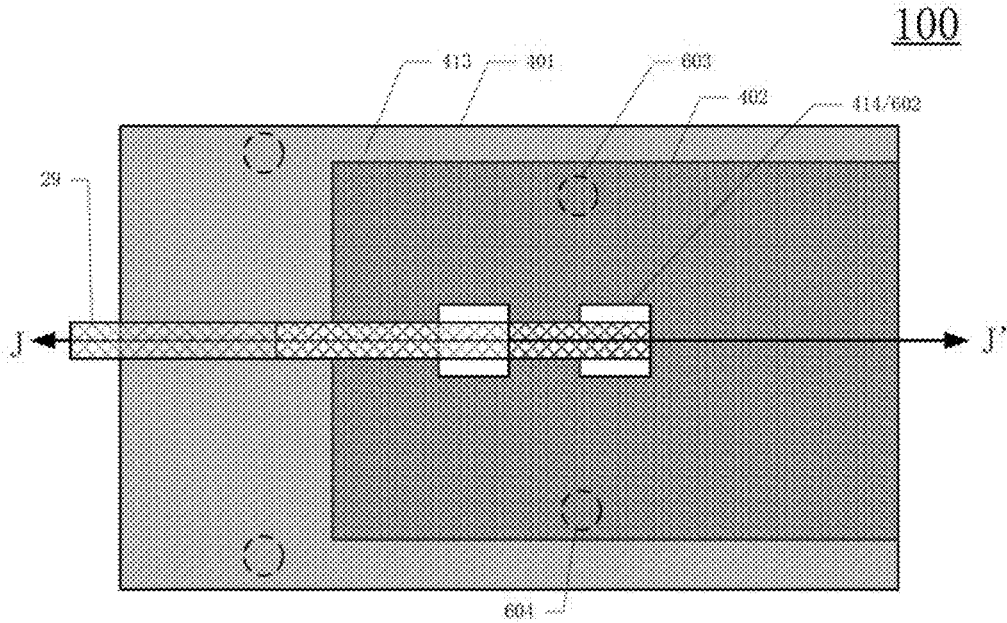
FIG. 25 is a schematic plan view of another display panel according to the present disclosure.
Figure 26:
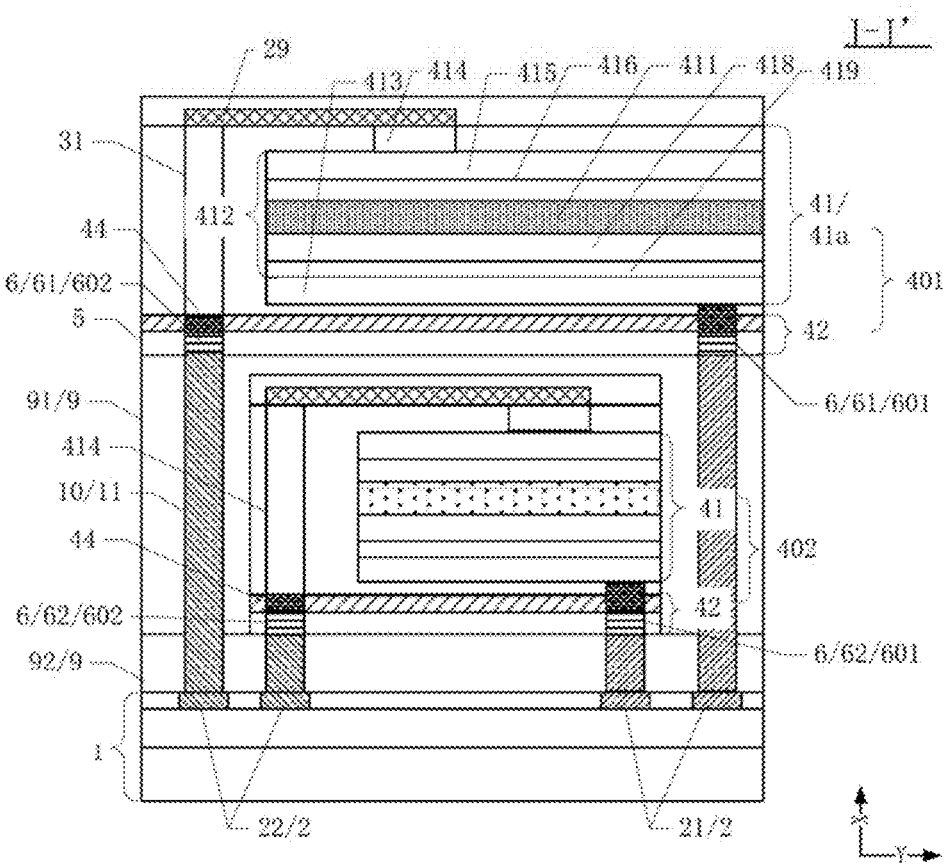
FIG. 26 is a cross-sectional view taken along J-J' in FIG. 25.

In some embodiments, still referring to FIG. 3, FIG. 4, FIG. 7, and FIG. 8, and referring to FIG. 25 and FIG. 26, FIG. 25 is a schematic plan view of another display panel according to the present disclosure, and FIG. 26 is a cross-sectional view taken along J-J in FIG. 25. The light-emitting element 41 includes a semiconductor stack 412, a first electrode 414, and a second electrode 413. In one or more embodiments, along the first direction X, the semiconductor stack 412 is located between the first electrode 414 and the second electrode 413. In another embodiment, along the first direction X, the first electrode 414 and the second electrode 413 are located at a same side of the semiconductor stack 412.

In some embodiments, the semiconductor stack 412 includes a GaN buffer layer 415, an N-type GaN layer 416 located at a side of the GaN buffer layer 415 close to the substrate 1, a quantum well light-emitting layer (that is, the light-emitting material layer 411) located at a side of the N-type GaN layer 416 away from the GaN buffer layer 415, a P-type GaN layer 418 located at a side of the quantum well light-emitting layer away from the GaN buffer layer 415, and an ohmic contact layer 419 located at a side of the P-type GaN layer 418 away from the GaN buffer layer 415.

In some embodiments, the first electrode 414 is the anode and the second electrode 413 is the cathode. In another embodiment, the first electrode 414 is the cathode and the second electrode 413 is the anode. The anode is electrically connected to the ohmic contact layer 419, and the cathode is electrically connected to the N-type GaN layer 416.

Under forward bias, electrons are injected into the quantum well light-emitting layer (that is, the light-emitting material layer 411) from the N-type GaN layer 416, and holes are injected into the quantum well light-emitting layer (that is, the light-emitting material layer 411) from the P-type GaN layer 418. In the quantum well light-emitting layer (that is, the light-emitting material layer 411), electrons and holes are subjected to radiative recombination in the light-emitting layer, generating light of the corresponding wavelength, and converting the electric energy into the light energy.

The light-emitting chip 4 of the present disclosure may be either a vertical-type light-emitting chip 4 or a horizontal-type light-emitting chip 4. The light-emitting chip 4 is a vertical-type light-emitting chip 4 when the semiconductor stack 412 is located between the first electrode 414 and the second electrode 413 along the first direction X. The light-emitting chip 4 is a horizontal-type light-emitting chip 4 when the first electrode 414 and the second electrode 413 are located at a same side of the semiconductor stack 412 along the first direction X. The first light-emitting chip 401 and the second light-emitting chip 402 shown in FIG. 3 and FIG. 4 are horizontal-type light-emitting chips 4. The third light-emitting chip 403 shown in FIG. 7 and FIG. 8 is also a horizontal-type light-emitting chip. The first light-emitting chip 401 and the second light-emitting chip 402 shown in FIGS. 25 and 26 are vertical-type light-emitting chips. FIG. 26 shows an example embodiment in which a first electrode 414 of the vertical-type light-emitting chip is located at a side of the semiconductor stack 412 away from the substrate 1. In another example embodiment, the second electrode 413 may be located at the side of the semiconductor stack 412 away from the substrate 1. The first electrode 414 is electrically connected to a bonding pad of the driver circuit 42 via a connection wire 29 and a connection pillar 31, the bonding pad is electrically connected to the second power signal connection portion 602 penetrating through the base 5 of the driver circuit 42, the second power signal connection portion 602 is electrically connected to the second power signal line 22 on the substrate 1 via the conductive portion 11, and the second electrode 413 is located at a side of the semiconductor stack 412 close to the substrate 1. The second electrode 413 is directly electrically connected to a bonding pad of the driver circuit 42, the bonding pad is electrically connected to the first power signal connection portion 601 penetrating through the base 5 of the driver circuit 42, and the first power signal connection portion 601 is electrically connected to the first power signal line 21 in the substrate 1 via another conductive portion 11.

The display panel of the present disclosure is applicable to both the vertical-type light-emitting chip and the horizontal-type light-emitting chip. It has a wider scope of application and enables diversification of product structures.

Figure 27:
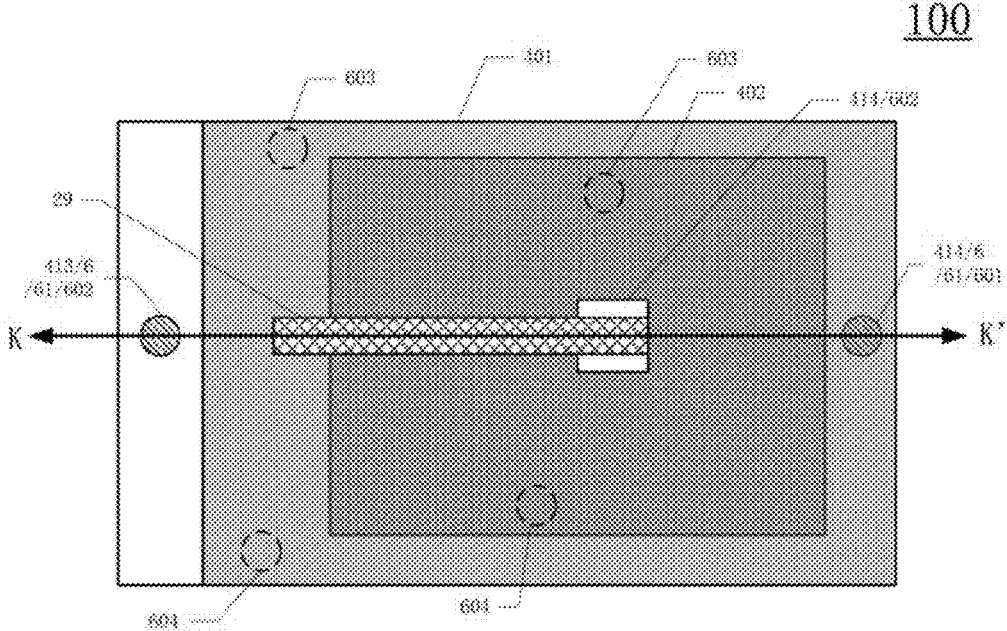
FIG. 27 is a schematic plan view of another display panel according to the present disclosure.
Figure 28:
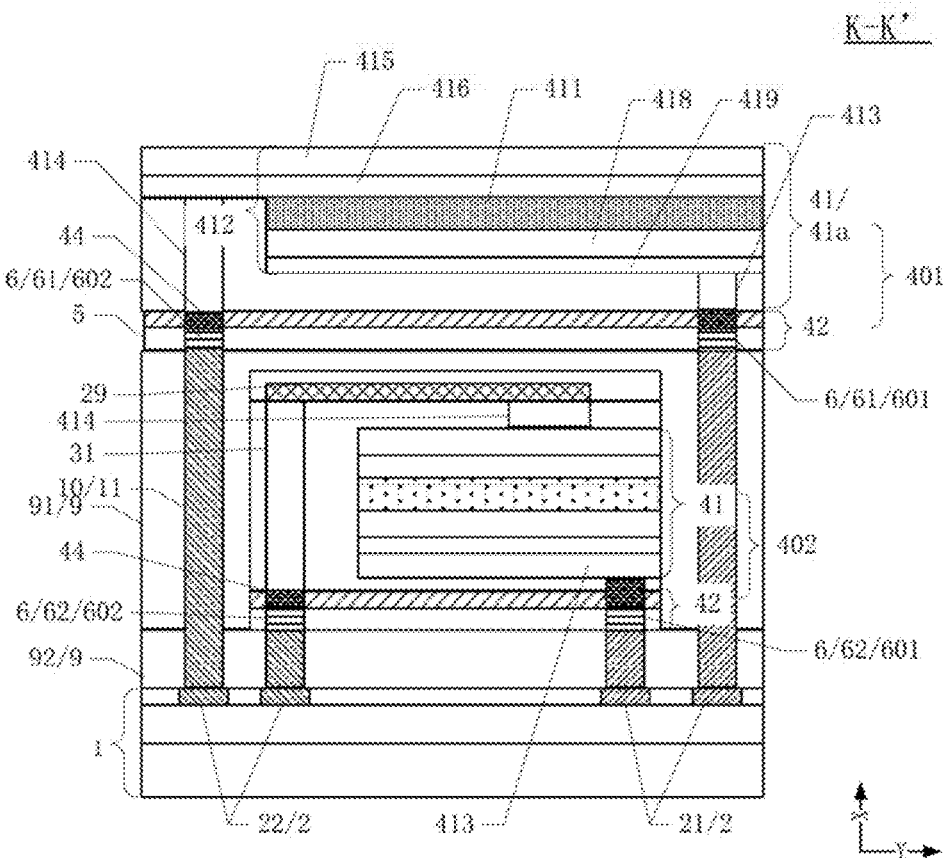
FIG. 28 is a cross-sectional view taken along K-K' in FIG. 27.

In some embodiments, referring to FIG. 27 and FIG. 28, FIG. 27 is a schematic plan view of another display panel according to the present disclosure, and FIG. 28 is a cross-sectional view taken along K-K' in FIG. 27. The first light-emitting chip 401 includes a first light-emitting element 41a. Along a first direction X, a first electrode 414 and a second electrode 413 of the first light-emitting element 41a are located at a same side of a semiconductor stack 412 of the first light-emitting element 41a.

The second light-emitting chip 402 includes a second light-emitting element 41b. Along the first direction X, a semiconductor stack 412 of the second light-emitting element 41b is located between a first electrode 414 and a second electrode 413 of the second light-emitting element 41b.

As shown in FIG. 28, the first light-emitting chip 401 is a horizontal-type light-emitting chip, and the second light-emitting chip 402 is a vertical-type light-emitting chip. The first electrode 414 of the second light-emitting chip 402 is electrically connected to a bonding pad of the driver circuit 42 via a connection wire 29 and a connection pillar 31, the bonding pad is electrically connected to the second power signal connection portion 602 penetrating through a base 5 of the driver circuit 42, and the second power signal connection portion 602 is electrically connected to a second power signal line 22 in the substrate 1 via a conductive portion 11. The second electrode 413 of the second light-emitting chip 402 is located at a side of the semiconductor stack 412 close to the substrate 1. The second electrode 413 is directly electrically connected to a bonding pad of the driver circuit 42, the bonding pad is electrically connected to a first power signal connection portion 601 penetrating through the base 5 of the driver circuit 42, and the first power signal connection portion 601 is electrically connected to a first power signal line 21 in the substrate 1 via another conductive portion 11.

In some embodiments, the third light-emitting chip 403 is a horizontal-type light-emitting chip. In other embodiments, the third light-emitting chip 403 is a vertical-type light-emitting chip, which is not shown in the figure.

In some embodiments, along the first direction X, the semiconductor stack 412 of the first light-emitting element 41a is located between the first electrode 414 and the second electrode 413 of the first light-emitting element 41a, and the first electrode 414 and the second electrode 413 of the second light-emitting element 41b are located at a same side of the semiconductor stack 412 of the first light-emitting element 41a. In this case, the first light-emitting chip 401 is a vertical-type light-emitting chip, and the second light-emitting chip 402 is a horizontal-type light-emitting chip. The display panel of the present disclosure is applicable to both the vertical-type light-emitting chip and the horizontal-type light-emitting chip. It has a wider scope of application and enables diversification of product structures.

Figure 29:
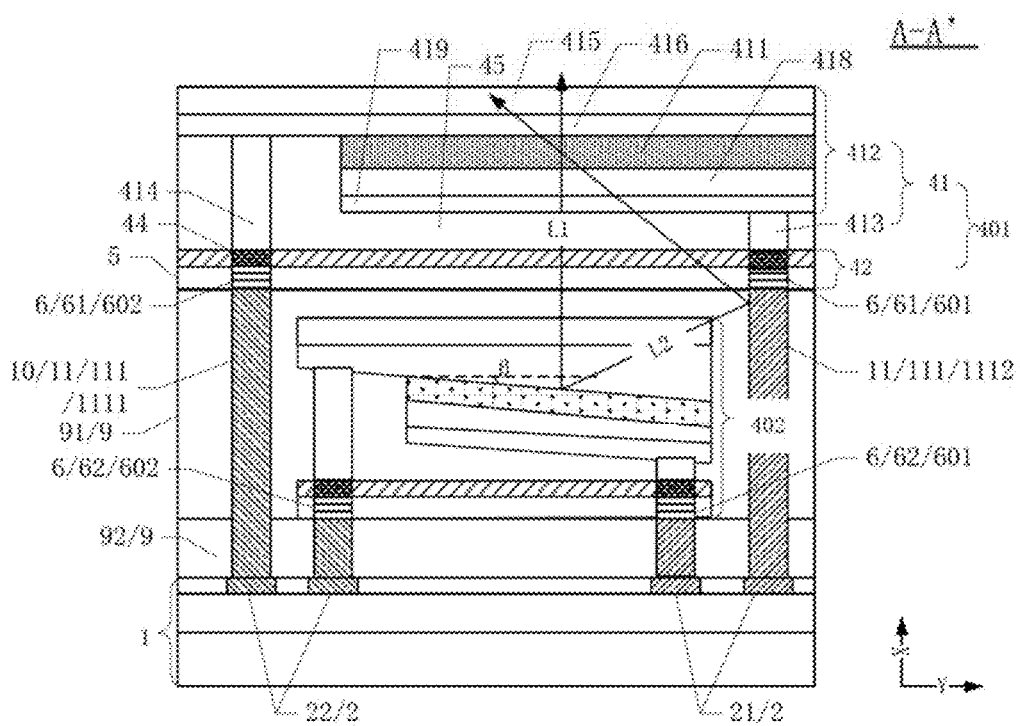
FIG. 29 is another cross-sectional view taken along A-A' in FIG. 2.

In some embodiments, referring to FIG. 29, FIG. 29 is another cross-sectional view taken along A-A' in FIG. 2. The light-emitting element 41 includes a light-emitting material layer 411, and a first angle between a plane of the light-emitting material layer 411 of the second light-emitting chip 402 and the plane of the substrate 1 is $\beta$, and $0 < \beta < 90°$.

The light-emitting material layer 411 of the second light-emitting chip 402 is a tilted structure, and the angle between the plane of the light-emitting material layer 411 of the second light-emitting chip 402 and the plane of the substrate 1 is between 0° and 90°. FIG. 29 shows an example embodiment in which the light-emitting material layer 411 of the second light-emitting chip 402 tilts to the second conductive portion 1112. In another example embodiment, the light-emitting material layer 411 of the second light-emitting chip 402 tilts to the first conductive portion 1111. The present disclosure is not limited hereto. In the present disclosure, because the light-emitting material layer 411 of the second light-emitting chip 402 is a tilted structure, light emitted by the second light-emitting chip 402 includes two types. One type of the light is emitted and transmitted in the first direction X, such as the light L1 in FIG. 29, and this type of light passes the first light-emitting chip 401 and then exits along the first direction X. The other type of light is emitted and transmitted in a direction forming an angle with the first direction X, such as the light L2 in FIG. 29. This this type of light is reflected by the surface of the second conductive portion 1112, and then incident on the first light-emitting chip 401. This can improve the exit light amount. In some embodiments, with reference to FIG. 21, the orthographic projections of the first conductive portion 1111 and the second conductive portion 1112 on the substrate 1 may be rectangles, to increase the areas of the side surfaces of the first conductive portion 1111 and the second conductive portion 1112 facing the second light-emitting chip 402.

In some embodiments, if the second light-emitting chip 402 is a blue light-emitting chip, in order to prevent the excitation of the red or green light-emitting chip caused by the blue light emitted by the blue light-emitting chip, the tilt angle of the light-emitting material layer 411 of the second light-emitting chip 402 may be adjusted to minimize the amount of blue light that enters the first light-emitting chip 401. For example, the first angle $\beta$ is increased, such that light reflected by the surface of the first conductive portion 1111 or the second conductive portion 1112 does not pass the light-emitting material layer 411 of the first light-emitting chip 401.

Figure 30:
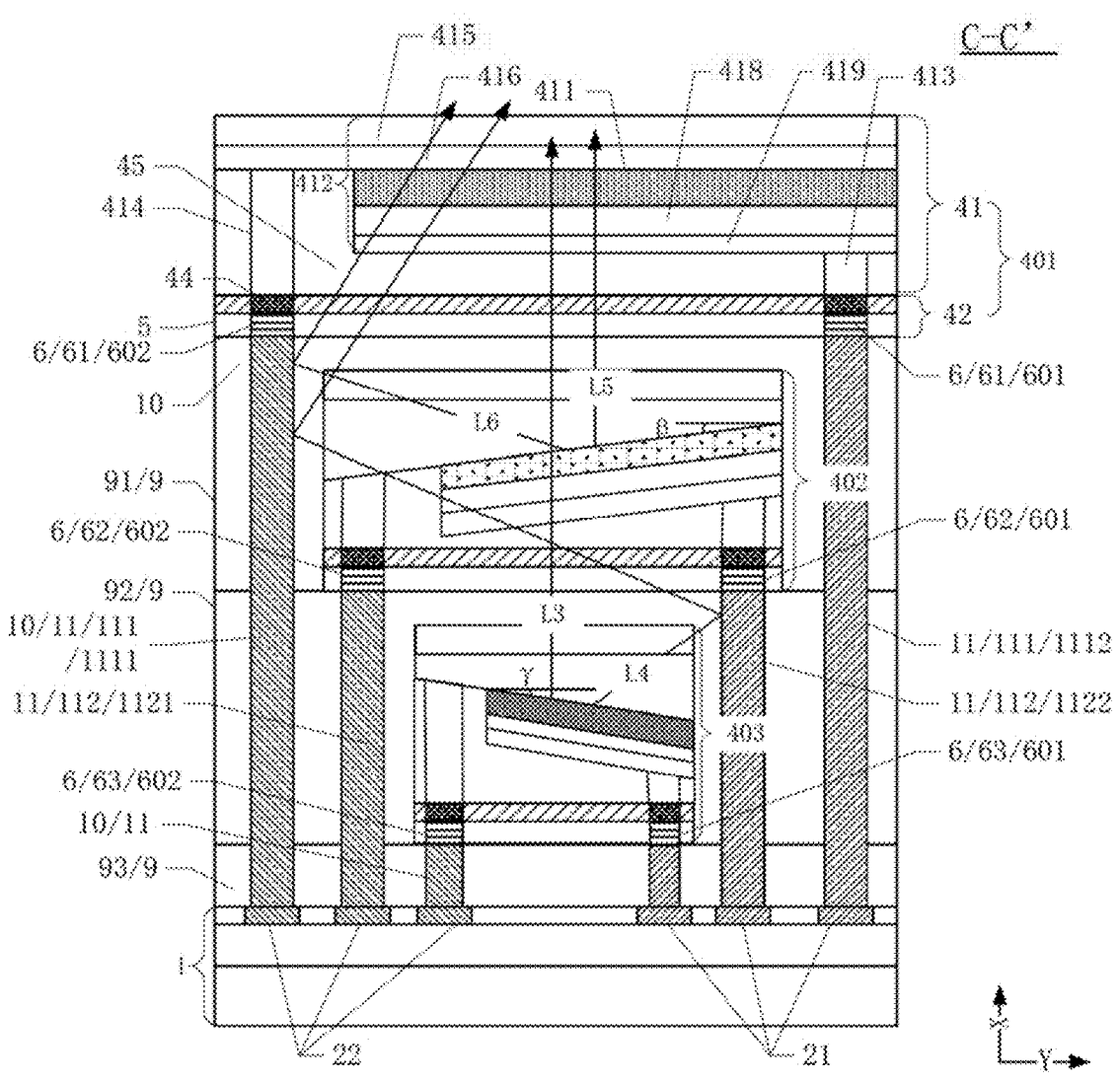
FIG. 30 is another cross-sectional view taken along C-C' in FIG. 6.

In some embodiments, referring to FIG. 30, FIG. 30 is another cross-sectional view taken along C-C' in FIG. 6. The light-emitting element group further includes a third light-emitting chip 403 located at a side of the second light-emitting chip 402 close to the substrate 1. An angle between a plane of a light-emitting material layer 411 of the third light-emitting chip 403 and the plane of the substrate 1 is $\gamma$, $0 < \gamma < 90°$ and $|\beta - \gamma| > 0$.

The light-emitting material layer 411 of the third light-emitting chip 403 is a tilted structure, and the angle between the plane of the light-emitting material layer 411 of the third light-emitting chip 403 and the plane of the substrate 1 is between 0° and 90°. FIG. 30 shows an example embodiment in which the light-emitting material layer 411 of the third light-emitting chip 403 tilts to the fourth conductive portion 1122. In another example embodiment, the light-emitting material layer 411 of the third light-emitting chip 403 tilts to the third conductive portion 1121. This is not limited hereto. In the present disclosure, because the light-emitting material layer 411 of the third light-emitting chip 403 is a tilted structure, light emitted by the third light-emitting chip 403 includes two types. One type of light is emitted and transmitted in the first direction X, such as the light L3 in FIG. 30, and this type of light passes the second light-emitting chip 402 and the first light-emitting chip 401 in sequence and then exits along the first direction X. The other type of light is emitted and transmitted in a direction forming an angle with the first direction X, such as the light L4 in FIG. 30. The type of light is reflected by the surface of the fourth conductive portion 1122, and then is incident on the surface of the first conductive portion 111 and reflected by the surface of the first conductive portion 1111, and then exits from the first light-emitting chip 401. As a result, the exit light amount is increased. In some embodiments, the orthographic projections of the third conductive portion 1121 and the fourth conductive portion 1122 on the substrate 1 may be rectangles, to increase the areas of the side surfaces of the third conductive portion 1121 and the fourth conductive portion 1122 facing the third light-emitting chip 403. In addition, the orthographic projections of the first conductive portion 1111 and the second conductive portion 1112 on the substrate 1 may be rectangles, to increase the areas of the side surfaces of the first conductive portion 1111 and the second conductive portion 1112 facing the second light-emitting chip 402, further increasing the exit light amount.

Certainly, in this embodiment, the light-emitting material layer 411 of the second light-emitting chip 402 is also a tilted structure, and the angle between the plane of the light-emitting material layer 411 of the second light-emitting chip 402 and the plane of the substrate 1 is between 0° and 900. FIG. 30 shows an example embodiment in which the light-emitting material layer 411 of the second light-emitting chip 402 tilts to the first conductive portion 1111. In another example embodiment, the light-emitting material layer 411 of the second light-emitting chip 402 tilts to the second conductive portion 1112. This is not limited hereto. In the present disclosure, because the light-emitting material layer 411 of the second light-emitting chip 402 is a tilted structure, light emitted by the second light-emitting chip 402 includes two types. One type of light is emitted and transmitted in the first direction X, such as the light L5 in FIG. 30. The type of light exits along the first direction X after passing the first light-emitting chip 401. The other type of light is emitted in a direction forming an angle with the first direction X, such as the light L6 in FIG. 30. The type of light is reflected by the surface of the first conductive portion 1111, and then is incident the first light-emitting chip 401. This can improve the exit light amount. In some embodiments, the orthographic projections of the first conductive portion 1111 and the second conductive portion 1112 on the substrate 1 may be rectangles, to increase the areas of the surfaces of the first conductive portion 1111 and the second conductive portion 1112 facing the second light-emitting chip 402, further increasing the exit light amount.

In the present disclosure, the tilting direction of the light-emitting material layer 411 of the third light-emitting chip 403 is different from that of the light-emitting material layer 411 of the second light-emitting chip 402, such that the reflection angles of the third light-emitting chip 403 and the second light-emitting chip 402 are also different. This can improve the light mixing effect.

In some embodiments, if the third light-emitting chip 403 is a blue light-emitting chip, in order to prevent excitation of the red or green light-emitting chip caused by the blue light emitted by the blue light-emitting chip, the tilt angle of the light-emitting material layer 411 in the third light-emitting chip 403 may be adjusted to minimize the amount of blue light that enters the second light-emitting chip 402 and the first light-emitting chip 401. For example, the first angle β is increased, such that light reflected by the surface of the third conductive portion 1121 or the fourth conductive portion 1122 does not pass the light-emitting material layer 411 of the second light-emitting chip 402, and light reflected by the surface of the first conductive portion 1111 or the second conductive portion 1112 does not pass the first light-emitting chip 401, reducing the excitation of the red or green light-emitting chip caused by the blue light.

In some embodiments, still referring to FIG. 3, FIG. 4, and FIG. 14, a sidewall of the light-emitting element 41 is coplanar with a sidewall of the driver circuit 42; and/or the driver circuit 42 includes a base 5, and a sidewall of the light-emitting element 41 is coplanar with a sidewall of the base 5.

In FIG. 3 and FIG. 4, the sidewall of the light-emitting element 41 is flush, that is, coplanar, with the sidewall of the driver circuit 42. In FIG. 14, the sidewall of the base 5 in the driver circuit 42 of the first light-emitting chip 401 is flush with the sidewall of the light-emitting element 41. In this case, the area of the electronic components in the driver circuit 42 is smaller than the area of the base 5.

It can be understood that during the manufacturing of the display panel, a plurality of light-emitting elements 41 are first formed, and then the light-emitting elements 41 are bonded to the driver circuits 42 on a wafer, and then the wafer is cut to simultaneously form the light-emitting chips 4. The driver circuits 42 may be in a CMOS wafer. Next, according to the emission colors, the light-emitting chips 4 are sequentially aligned and stacked on the substrate 1 using mass transfer technology.

In the present disclosure, the light-emitting elements 41 are bonded to the driver circuits 42 on the wafer, and then the wafer is cut to form the light-emitting chips 4 at the same time, which can simplify the manufacturing process.

Figure 31:
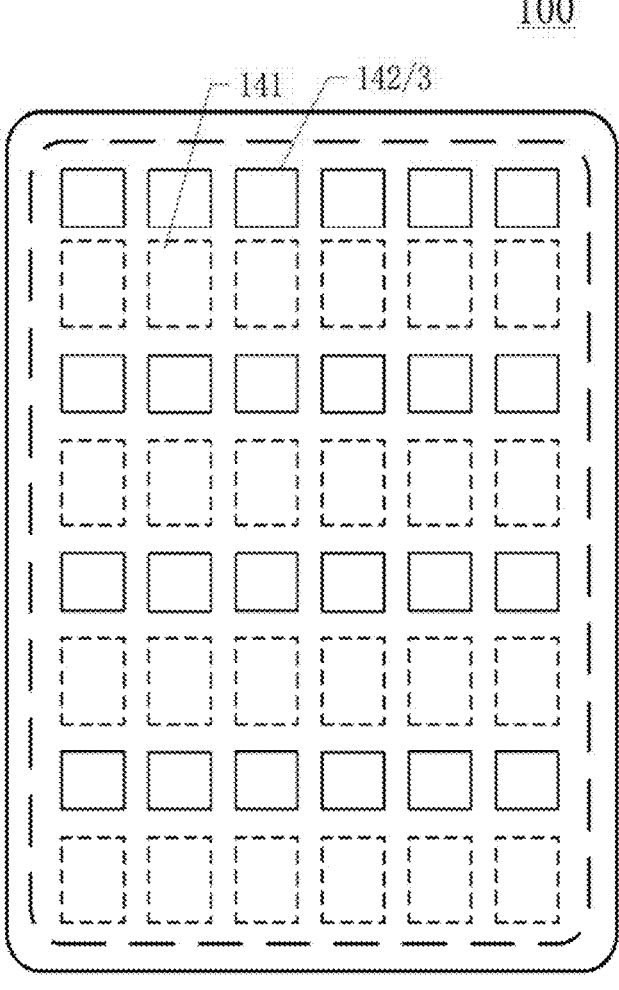
FIG. 31 is a schematic plan view of another display panel according to the present disclosure.

In some embodiments, referring to FIG. 31, FIG. 31 is a schematic plan view of another display panel according to the present disclosure. The display panel in FIG. 31 includes a first region 141 and a second region 142, the light transmittance of the first region 141 is greater than that of the second region 142, and the second region 142 includes the light-emitting element groups 3.

The display panel in the present disclosure is a transparent display panel. The second region 142 includes the light-emitting element group 3 according to any of the above embodiments. The light transmittance of the first region 141 is greater than that of the second region 142. In some embodiments, the first region 141 and the second region 142 are disposed adjacent to each other. Certainly, the arrangement is only for the schematic illustration, and does not limit the present disclosure. In some embodiments, for example, the first region 141 may be a transparent region, the second region 142 is the display region, and the light-emitting element groups 3 are disposed in the second region 142. The second region 142 displays the images, and the first region 141 is transparent, such that the display panel can realize clear display and ensure high light transmittance, thereby realizing transparent display. Since the light-emitting element group 3 provided in the second region 142 includes a plurality of stacked light-emitting chips 4, the resolution can be improved, and the display panel of the present disclosure is particularly suitable for transparent display panels with high resolution.

Figure 33:
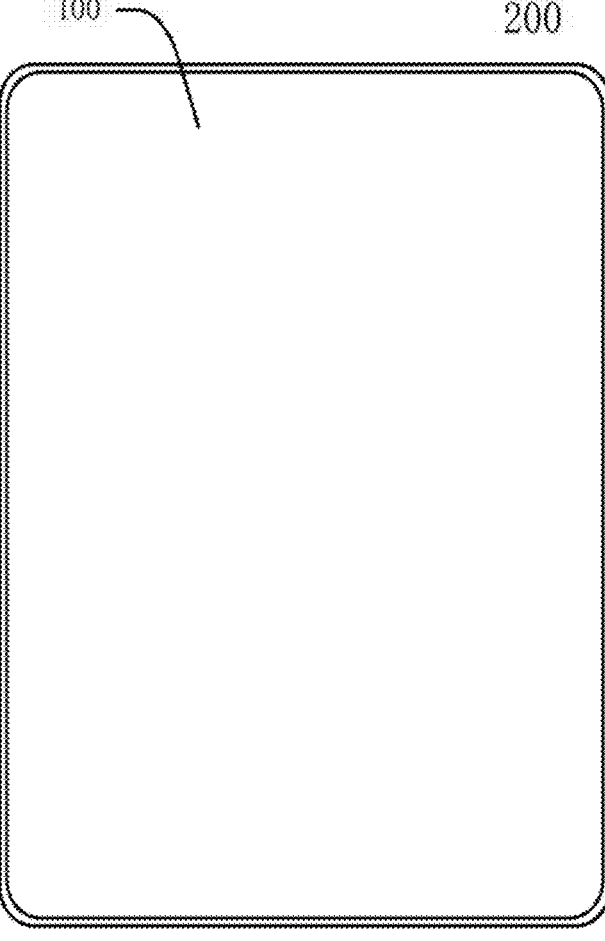
FIG. 33 is a schematic structural diagram of a display apparatus according to the present disclosure.

The present disclosure further provides a display apparatus 200. FIG. 33 is a schematic structural diagram of a display apparatus according to an embodiment of the present disclosure. The display apparatus 200 includes the display panel 100 according to the above embodiments. The embodiment of FIG. 33 illustrates the display apparatus 200 with a cellular phone as an example, and it is understood that the display apparatus 200 may be a computer, a television, an electronic paper, an automotive display, and other display apparatuses with the display function. The display apparatus 200 according to the present disclosure has the beneficial effects of the display panel 100 according to the embodiments of the present disclosure, and details are not repeated herein in this embodiment.

It can be learned from the above embodiments that, compared with the prior art, the display panel and the display apparatus according to the present disclosure can realize at least the following beneficial effects.

The display panel of the present disclosure includes a substrate and a light-emitting element group located at a side of the substrate. Signal lines are provided on the substrate. The light-emitting element group includes light-emitting chips, the signal lines are electrically connected to the light-emitting element group, and electrical signals for driving the light-emitting chips to emit light are transmitted through the signal lines. Each light-emitting chip includes a light-emitting element and a driver circuit that are stacked. The light-emitting chip has both light-emitting and driving functions, and thus there is no need to provide a driver circuit on the substrate. It is justed needed to arrange the signal lines on the substrate. This can improve the space utilization of the substrate and thus improve the resolution. The light-emitting chips of the present disclosure include at least a first light-emitting chip located at a side of the substrate, and a second light-emitting chip located at a side of the first light-emitting chip close to the substrate. By stacking the first light-emitting chip at a side of the second light-emitting chip away from the substrate, the resolution of the display panel can be improved. According to the present disclosure, in the first direction, an orthographic projection area of the second light-emitting chip is smaller than that of the first light-emitting chip, and the first direction is perpendicular to the plane of the substrate. Because the area of the first light-emitting chip away from the substrate is larger, wires can be reduced when the first light-emitting chip and the second light-emitting chip are connected to the substrate, thus reducing the wiring space, and further improving the resolution.

Although some embodiments of the present disclosure have been explained in detail through examples, those skilled in the art should understand that the above examples are only for illustration and not intended to limit the scope of the present disclosure. Those skilled in the art should understand that modifications can be made to the aforementioned embodiments without departing from the scope and spirit of the present disclosure. The scope of the present disclosure is defined by the appended claims.

What is claimed is:

1. A display panel, comprising:
a substrate comprising signal lines; and
a light-emitting element group located at a side of the substrate and electrically connected to the signal lines,
wherein the light-emitting element group comprises light-emitting chips, each light-emitting chip comprises a light-emitting element and a driver circuit that are stacked, and the driver circuit is configured to drive the light-emitting element to emit light,
wherein the light-emitting chips comprise a first light-emitting chip located at the side of the substrate, a second light-emitting chip located at a side of the first light-emitting chip adjacent to the substrate, and a third light-emitting chip located at a side of the second light-emitting chip adjacent to the substrate, and
wherein in a first direction perpendicular to the substrate, an orthographic projection area of the second light-emitting chip is smaller than an orthographic projection area of the first light-emitting chip, and an orthographic projection area of the third light-emitting chip is smaller than the orthographic projection area of the second light-emitting chip in the first direction.

2. The display panel according to claim 1, wherein:
the first light-emitting chip is a blue light-emitting chip, and
the second light-emitting chip is one of a red light-emitting chip or a green light-emitting chip, and the third light-emitting chip is the other one of the red light-emitting chip or the green light-emitting chip.

3. The display panel according to claim 1, wherein the light-emitting element of each light-emitting chip comprises a light-emitting material layer, wherein a luminous efficacy of the light-emitting material layer of the first light-emitting chip is lower than that of the light-emitting material layer of the second light-emitting chip, and wherein the first light-emitting chip is a red light-emitting chip, and the second light-emitting chip is a green light-emitting chip or a blue light-emitting chip.

4. The display panel according to claim 1, wherein the light-emitting element of each light-emitting chip comprises a light-emitting material layer; and
an orthographic projection of the light-emitting material layer of the first light-emitting chip is at least partially non-overlapping with an orthographic projection of the light-emitting material layer of the second light-emitting chip.

5. The display panel according to claim 1, wherein a quantity of light-emitting elements in the first light-emitting chip is greater than a quantity of light-emitting elements in the second light-emitting chip.

6. The display panel according to claim 1, wherein:
the driver circuit comprises a base;
the light-emitting chip comprises a connection portion penetrating through the base; and
the connection portion comprises a first-type connection portion and a second-type connection portion,
wherein the first light-emitting chip is electrically connected to the signal line through the first-type connection portion, the second light-emitting chip is electrically connected to the signal line through the second-type connection portion, and the first-type connection portion and the second-type connection portion are at least partially non-overlapping in the first direction.

7. The display panel according to claim 6, wherein:
the first-type connection portion comprises a first connection portion, a second connection portion, and a first connection line comprising a virtual connection line between the first connection portion and the second connection portion; and
the second-type connection portion comprises a third connection portion, a fourth connection portion, and a second connection line comprising a virtual connection line between the third connection portion and the fourth connection portion,
wherein an angle between the first connection line and the second connection line is a, wherein $0<\alpha<90°$.

8. The display panel according to claim 6, wherein the display panel further comprises a planarization layer located between the light-emitting chip and the substrate,
wherein the planarization layer comprises a via structure, the connection portion of the light-emitting chip is electrically connected to the signal line of the substrate via a conductive portion in the via structure, and the conductive portion at least partially overlaps with the connection portion in the first direction.

9. The display panel according to claim 8, wherein the planarization layer comprises a first planarization layer and a second planarization layer,
wherein in the first direction, the first planarization layer is at least partially located between the first light-emitting chip and the second light-emitting chip, the first planarization layer comprises a first via structure, the second planarization layer is at least partially located between the second light-emitting chip and the substrate, the second planarization layer comprises a second via structure, and the first via structure at least partially overlaps with the second via structure in the first direction.

10. The display panel according to the claim 9, wherein a first wire is provided at a side of the second planarization layer away from the substrate, a first end of the first wire is connected to a first electrode of the second light-emitting element, and a second end of the first wire is connected to a conductive portion in the second via structure.

11. The display panel according to claim 8, wherein the conductive portion comprises a first-type conductive portion, wherein the first light-emitting chip is electrically connected to the signal line of the substrate via the first-type conductive portion, and the first-type conductive portion comprises a first conductive portion and a second conductive portion, and in a direction parallel to the plane of the substrate, the second light-emitting chip is located between the first conductive portion and the second conductive portion.

12. The display panel according to claim 1, wherein:

the driver circuit comprises a base, the light-emitting chip comprises a connection portion penetrating through the base, the connection portion comprises a first power signal connection portion and a second power signal connection portion for transmitting power signals, the first power signal connection portion and the second power signal connection portion are arranged in a second direction, and the connection portion further comprises a data signal connection portion for transmitting data signals and a strobe signal connection portion for transmitting enable signals, wherein the data signal connection portion and the strobe signal connection portion are arranged in a third direction, wherein the second direction and the third direction are parallel to the plane of the substrate, and the second direction intersects with the third direction.

13. The display panel according to claim 12, wherein in the second direction, at least one of the data signal connection portion or the strobe signal connection portion is located between the first power signal connection portion and the second power signal connection portion.

14. The display panel according to claim 1, wherein the light-emitting element comprises a semiconductor stack, a first electrode, and a second electrode, and in the first direction, the semiconductor stack is located between the first electrode and the second electrode, or in the first direction, the first electrode and the second electrode are located at a same side of the semiconductor stack.

15. The display panel according to claim 14, wherein the first light-emitting chip comprises a first light-emitting element, wherein, in the first direction, a first electrode and a second electrode of the first light-emitting element are located at a same side of a semiconductor stack of the first light-emitting element; and the second light-emitting chip comprises a second light-emitting element, wherein, in the first direction, a semiconductor stack of the second light-emitting element is located between a first electrode and a second electrode of the second light-emitting element.

16. The display panel according to claim 1, wherein each light-emitting element comprises a light-emitting material layer, and a first angle between the plane of the substrate and a plane of a light-emitting material layer of the second light-emitting chip is β, wherein 0<β<90°.

17. The display panel according to claim 1, wherein a sidewall of the light-emitting element is coplanar with a sidewall of the driver circuit, and/or the driver circuit comprises a base, and the sidewall of the light-emitting element is coplanar with a sidewall of the base.

18. The display panel according to claim 1, further comprising a first region and a second region, wherein a light transmittance of the first region is greater than a light transmittance of the second region, and the second region comprises the light-emitting element group.

19. A display apparatus, comprising a display panel, wherein the display panel comprises:

a substrate comprising signal lines; and a light-emitting element group located at a side of the substrate and electrically connected to the signal lines, wherein the light-emitting element group comprises light-emitting chips, each light-emitting chip comprises a light-emitting element and a driver circuit that are stacked, and the driver circuit is configured to drive the light-emitting element to emit light, wherein the light-emitting chips comprise a first light-emitting chip located at the side of the substrate, a second light-emitting chip located at a side of the first light-emitting chip adjacent to the substrate, and a third light-emitting chip located at a side of the second light-emitting chip adjacent to the substrate, and wherein in a first direction perpendicular to the substrate, an orthographic projection area of the second light-emitting chip is smaller than an orthographic projection area of the first light-emitting chip, and an orthographic projection area of the third light-emitting chip is smaller than the orthographic projection area of the second light-emitting chip in the first direction.

20. A display panel, comprising:

a substrate comprising signal lines; and a light-emitting element group located at a side of the substrate and electrically connected to the signal lines, wherein the light-emitting element group comprises light-emitting chips, each light-emitting chip comprises a light-emitting element and a driver circuit that are stacked, and the driver circuit is configured to drive the light-emitting element to emit light, wherein the light-emitting chips comprise a first light-emitting chip located at the side of the substrate, and a second light-emitting chip located at a side of the first light-emitting chip adjacent to the substrate, wherein in a first direction perpendicular to the substrate, an orthographic projection area of the second light-emitting chip is smaller than an orthographic projection area of the first light-emitting chip, and wherein the light-emitting element of each light-emitting chip comprises a light-emitting material layer, and a luminous efficacy of the light-emitting material layer of the first light-emitting chip is lower than that of the light-emitting material layer of the second light-emitting chip.

* * * * *